United States Patent [19]
Fuke et al.

[11] Patent Number: 6,057,049
[45] Date of Patent: *May 2, 2000

[54] EXCHANGE COUPLING FILM AND MAGNETORESISTIVE ELEMENT

[75] Inventors: Hiromi Fuke, Kawasaki; Yuuzo Kamiguchi, Yokohama; Susumu Hashimoto, Ebina; Tomomi Funayama, Fujisawa; Kazuhiro Saito, Yokohama; Hitoshi Iwasaki, Yokosuka; Masashi Sahashi, Yokohama, all of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/571,803

[22] Filed: Dec. 13, 1995

[30] Foreign Application Priority Data

Dec. 13, 1994 [JP] Japan .................................... 6-308630
Sep. 22, 1995 [JP] Japan .................................... 7-244554

[51] Int. Cl.⁷ .............................. B32B 15/01; G11B 5/127
[52] U.S. Cl. ........................ 428/700; 428/693; 428/668; 360/113; 365/158
[58] Field of Search .................................... 428/611, 615, 428/655, 668, 694 TM, 694 MM, 693, 694 TR, 694 EC, 700; 252/62.51, 62.55; 324/252; 360/113, 126; 365/158; 117/939

[56] References Cited

U.S. PATENT DOCUMENTS

| | | | |
|---|---|---|---|
| 4,103,315 | 7/1978 | Hempstead et al. | 360/110 |
| 4,755,897 | 7/1988 | Howard | 360/113 |
| 5,014,147 | 5/1991 | Parkin et al. | 360/113 |
| 5,287,237 | 2/1994 | Kitada et al. | 360/113 |
| 5,287,737 | 2/1994 | Kitada et al. | 360/113 |
| 5,315,468 | 5/1994 | Lin et al. | 360/113 |
| 5,436,778 | 7/1995 | Lin et al. | 360/113 |
| 5,552,949 | 9/1996 | Hashimoto et al. | 360/113 |
| 5,576,915 | 11/1996 | Akiyama et al. | 360/113 |
| 5,756,191 | 5/1998 | Hashimoto et al. | 428/209 |

FOREIGN PATENT DOCUMENTS

| | | |
|---|---|---|
| 4-162207 | 6/1992 | Japan . |
| 4211106 | 8/1992 | Japan . |

OTHER PUBLICATIONS

Patent Abstracts of Japan, vol. 940, No. 011, JP–A–06 314617. (Nov. 1994).

K. Sumiyama et al., "Mossbauer Study of Metastable f.c.c. Fe–Rh Alloy", Physica Status Solidi A, vol. 13, No. 1, Sep. 1972, pp. K75–k77.

*Primary Examiner*—Deborah Jones
*Assistant Examiner*—Michael LaVilla
*Attorney, Agent, or Firm*—Foley & Lardner

[57] ABSTRACT

An exchange coupling film comprises a ferromagnetic film and an antiferromagnetic film laminated on the ferromagnetic film, wherein at least a portion of the antiferromagnetic film has a face-centered cubic crystal structure and the antiferromagnetic film comprises an IrMn alloy represented by the general formula of $Ir_xMn_{100-x}$, wherein x stands for a value by atomic % satisfying the expression, $2 \leq x \leq 80$.

12 Claims, 13 Drawing Sheets

EXCHANGE COUPLING FILM AND MAGNETORESISTIVE ELEMENT

BACKGROUND OF THE INVENTION

1. Field of the Invention

This invention relates to an exchange coupling film utilizing the exchange coupling between an antiferromagnetic film and a ferromagnetic film and magnetoresistive elements such as magnetic field sensors and reproducing magnetic heads which are provided with such an exchange coupling film as mentioned above.

2. Description of the Related Art

The study of a magnetic head using a magnetoresistive element as a reproducing head for the sake of high-density magnetic recording has been heretofore studied. At present, a thin film of 80at % Ni - 20at % Fe alloy (otherwise known as "Permalloy") is generally used as a magnetoresistive material. As alternatives to this material, artificial lattice films such as of (Co/Cu)n which exhibits a giant magnetoresistive effect and spin valve films have been attracting attention in recent years.

Incidentally, since magnetoresistive films using these materials have magnetic domains, the Barkhausen noise originating by multi-domain activities poses a serious problem in the way to the commercialization the films. Various methods for imparting a single domain to the magnetoresistive films have been being studied from various angles. A method which resides in controlling in a specific direction the domains of a magnetoresistive film by utilizing the exchange coupling between a magnetoresistive film which is a ferromagnetic film and an antiferromagnetic film is counted among these methods. As the antiferromagnetic material used for exchange coupling, a γ-FeMn alloy has been heretofore finding wide recognition (disclosed in U.S. Pat. No. 4,103,315 and U.S. Pat. No. 5,315,468, for example).

Further, the technique utilizing an exchange coupling between an antiferromagnetic film and a ferromagnetic film for pinning a magnetization of a magnetic film of a spin valve film has been disseminating in recent years. Also for this purpose, a γ-FeMn alloy has been used as an antiferromagnetic material.

The γ-FeMn alloy, however, is deficient in resistance to corrosion, particularly to the corrosion due to water, and is at a disadvantage in suffering the yield of elements being produced to be notably lowered and the force of exchange coupling with a magnetoresistive element to be deteriorated with time as by the corrosion during the course of fabrication of the magnetoresistive element and by the corrosion by the moisture in the air.

The antiferromagnetic film which is made of the γ-FeMn alloy is problematic in respect that the force of exchange coupling with the ferromagnetic film is markedly altered by the temperature environment. Since the temperature of element parts of the magnetic head ultimately rises to the neighborhood of 80° C. during the operation of the magnetic head, the blocking temperature at which the force of exchange coupling between the ferromagnetic film and the antiferromagnetic film is wholly lost ought to be as high as permissible. Since the blocking temperature of the γ-FeMn alloy system is not higher than 200° C., the antiferromagnetic film under discussion is at a disadvantage in exhibiting only inferior lasting reliability.

U.S. Pat. No. 4,103,315, for example, discloses cases of using antiferromagnetic films made of such γ-Mn alloys as PtMn and RhMn other than the γ-FeMn alloy and also cases of using antiferromagnetic films made of such oxides as NiO. The anti-ferromagnetic films made of such γ-Mn alloys as PtMn and RhMn, however, exhibit no sufficient force of exchange coupling with a ferromagnetic film. In contrast, the antiferromagnetic films made of such oxides as NiO exhibit inferior thermal stability and exhibit unstable force of exchange coupling with a ferromagnetic film at such high temperatures as exceed about 100° C. Further, such oxide systems as NiO exhibit high electric resistance, permit no direct derivation of an electrode therefrom, and entail the disadvantage of complicating the construction of an element.

U.S. Pat. No. 5,315,468 discloses an observation that when an antiferromagnetic film is formed of such a θ-Mn alloy as NiMn which has a face-centered tetragonal (fct) crystal structure, the force of exchange coupling between the antiferromag-netic film and a ferromagnetic film is not degraded even in a range of high temperatures.

The antiferromagnetic film of this nature, as deposited, exhibits a very small force of exchange coupling with a ferromagnetic film and, for the sake of acquiring a fully satisfactory force of coupling, must undergo a heat treatment at a high temperature in the neighborhood of 250° C. by all means. When the antiferromagnetic film of this sort is adopted, therefore, the process of production is complicated to the extent of lowering the yield of production and degrading the reliability of the product.

Antiferromagnetic films have been heretofore used, as described above, for attaining exchange coupling with ferromagnetic films as by abating the Barkhausen noise inherent in magnetoresistive elements. The conventional antiferromagnetic films, however, suffer from deficiency in force of exchange coupling with a ferromagnetic film or in resistance to corrosion particularly at elevated temperatures and incur difficulty in producing exchange coupling films of fully satisfactory reliability with a high yield.

SUMMARY OF THE INVENTION

The purpose of this invention is to clear the problems encountered as described above.

An object is the provision of an exchange coupling film which is provided with an antiferromagnetic film exhibiting ample force of exchange coupling with a ferromagnetic film even in a range of high temperature and, at the same time, excelling in resistance to corrosion, produced by a simple process, and possessed of good reliability and a magnetoresistive element which is provided with the exchange coupling film and enabled to produce stable output for a long time.

A first exchange coupling film according to this invention is an exchange coupling film obtained by laminating an antiferromagnetic film and a ferromagnetic film and characterized in that at least a portion of the antiferromagnetic film has a face-centered cubic crystal structure and made of an IrMn alloy of a composition represented by the general formula, $Ir_xMn_{100-x}$, wherein x stands for a value by at % satisfying the expression, $2 \leq x \leq 80$.

The second exchange coupling film according to this invention is an exchange coupling film obtained by laminating an antiferro-magnetic film and a ferromagnetic film and characterized in that the antiferromagnetic film is made of an IrMn alloy of a composition represented by the general formula, $Ir_xMn_{100-x}$, wherein x stands for a value by at % satisfying either of the expressions, $2 \leq x \leq 35$ and $60 \leq x \leq 80$.

The third exchange coupling film according to this invention is an exchange coupling film obtained by laminating an antiferromagnetic film and a ferromagnetic film and characterized in that the antiferromagnetic film is made of an IrMn alloy of a composition represented by the general formula, $(Ir_{x'}Mn_{1-x'})_{100-y}Fe_y$, wherein x' stands for a value by atomic ratio satisfying the expression, $0.02 \leq x' \leq 0.80$, and y for a value by at % satisfying the expression, $0 < y < 30$.

Then, the magnetoresistive element of this invention is characterized by being provided with such an exchange coupling film as mentioned above and an electrode for feeding an electric current at least to the ferromagnetic film in the exchange coupling film.

To be specific, this invention is characterized by using an IrMn alloy possessed of specific crystal structure and composition for the antiferromagnetic film in the exchange coupling film.

Now, this invention will be described in detail below.

The first exchange coupling film according to this invention is provided with a basic structure formed by laminating an antiferromagnetic film made of an IrMn alloy and a ferromagnetic film.

This first exchange coupling film is enabled to acquire an amply large force of exchange coupling even in a range of high temperatures particularly by laminating an antiferromagnetic film at least a portion of which has a face-centered cubic crystal structure and made of an IrMn alloy of a composition represented by the general formula, $Ir_xMn_{100-x}$, ($2 \leq x \leq 80$) and a ferromagnetic film.

The IrMn alloy which is possessed of the face-centered cubic crystal structure exhibits a high Néel temperature. When it is utilized in the exchange coupling film of such a basic structure as mentioned above, it manifests a high blocking temperature therein and consequently imparts improved reliability to the ultimately obtained exchange coupling film and manifests a highly satisfactory force of exchange coupling with the ferromagnetic film.

Further, particularly when the exchange coupling between a ferromagnetic film and an antiferromagnetic film is utilized for controlling magnetic domains of the ferromagnetic film as a magnetoresistive film and for magnetically pinning a pinned layer of a spin valve film and the like, the IrMn alloy which has a face-centered cubic crystal structure proves advantageous in terms of the lattice matching property to be exhibited to a ferromagnetic film which has a face-centered cubic crystal structure or a hexagonal closest packing crystal structure.

Conversely, in the IrMn alloy which has a face-centered tetragonal crystal structure, the ratio of the lattice constants of the c axis and the a axis, c/a, is 1.355, a very large magnitude, and moreover the lattice constant in the direction of the a axis is less than about 0.3 nm. This IrMn alloy, therefore, exhibits a poor lattice matching property to a ferromagnetic film which generally forms a face-centered cubic crystal structure having a lattice constant of about 0.35 nm and does not easily produce an ample force of exchange coupling therewith.

In the first exchange coupling film according to this invention, the IrMn alloy which has a face-centered cubic crystal structure as described above and a composition represented by the general formula, $Ir_xMn_{100-x}$ ($2 \leq x \leq 80$), is used for the antiferromagnetic film. The reason for this specific composition is that the corrosion resistance of the IrMn alloy tends to decline when the Ir content of this alloy is small and the antiferromagnetism tends to be weak when the Ir content is large. For the sake of this invention, the Ir content of the IrMn alloy is preferably in this range, $5 \leq x \leq 40$.

The second exchange coupling film according to this invention is an exchange coupling film obtained by laminating an antiferromagnetic film and a ferromagnetic film and characterized in that the antiferromagnetic film is made of an IrMn alloy having a composition represented by the general formula, $Ir_xMn_{100-x}$, and an Ir content x in either of the ranges, 2 to 35 at % and 60 to 80 at %.

The IrMn alloy generally has the face-centered tetragonal crystal structure thereof stabilized when the Ir content, x, is in the range of $35 < x < 60$.

In the second exchange coupling film according to the present invention, it is more advantageous to use the IrMn alloy having a composition represented by the general formula, $Ir_xMn_{100-x}$ ($2 \leq x \leq 35$, $60 \leq x \leq 80$) or better still $Ir_xMn_{100-x}$ ($5 \leq x \leq 35$).

When an IrMn alloy is epitaxially grown on a film such as of Cu having a face-centered cubic crystal structure or on a magnetoresistive film formed mainly of Fe, Co, or Ni or an alloy thereof, however, an antiferromagnetic film which is formed of an IrMn alloy having a face-centered cubic crystal structure and a composition in which the Ir content is in the range, $35 < x < 60$, can be produced.

In this invention, so long as the antiferromagnetic film is formed of an IrMn alloy having a face-centered cubic crystal structure, this film incurs no particular hindrance even when the IrMn alloy has a composition the Ir content of which is in the range, $35 < x < 60$, as in the first exchange coupling film according to this invention.

The antiferromagnetic film in the third exchange coupling film according to this invention has a composition represented by the general formula, $(Ir_{x'}Mn_{1-x'})_{100-y}Fe_y$, wherein x' stands for a value by atomic ratio satisfying the expression, $0.02 \leq x' \leq 0.80$, and y for a value by at % satisfying the expression, $0 < y < 30$.

The antiferromagnetic film in the third exchange coupling film according to this invention is formed of an alloy composition having Fe added to the IrMn alloy forming the antiferromagnetic film in the first exchange coupling film according to this invention.

The reason for defining the value of x' to be not less than 0.02 is that the corrosion resistance of the antiferromagnetic film is unduly low when the Ir content is less than 0.02 and the blocking temperature of the antiferromagnetic film is unduly low when the Ir content exceeds 0.8. More preferably, the value of x' is in the range, $0.05 \leq x' \leq 0.40$.

Fe fulfills the role of enhancing the lattice matching property of the antiferromagnetic film with the ferromagnetic film and exalting the force of exchange coupling. The value of y must be less than 30 because the corrosion resistance is notably lowered when the value of y exceeds 30. More preferably, the value of y is in the range, $0.01 \leq y \leq 25$.

Likewise in the third exchange coupling film according to this invention, both the antiferromagnetic film and the ferromagnetic film which form the exchange coupling film preferably form a face-centered cubic (fcc) crystal structure.

Further, in an embodiment of the present invention, since both the ferromagnetic film and the antiferromagnetic film form a (111) plane orientation, the ferromagnetic film having a hexagonal crystal structure may be used. Incidentally, as stated above with respect to the first and the second exchange coupling film according to this invention, the $Ir_{x'}Mn_{1-x'}$ type alloy in bulk has a face-centered tetragonal (fct) crystal structure when the composition of the alloy has an Ir content, x', in the range, $0.35 < x' < 0.60$. This IrMn type alloy of the face-centered tetragonal crystal structure has such a small lattice constant, a, of about 0.273 nm and such a fairly large c/a ratio of 1.355. In contrast, the ferromagnetic film having a face-centered cubic (fcc) crystal structure has a lattice constant of about 0.35 nm. When the $(Ir_xMn_{1-x})_{100-y}Fe_y$ (0.35<x'<0.60) type alloy is used as the antiferromagnetic film, therefore, it is predicted that this film will exhibit a poor lattice matching property to the ferromagnetic film and will not easily produce a satisfactory force of exchange coupling.

When the $(Ir_xMn_{1-x})_{100-y}Fe_y$ type alloy having a composition whose Ir content, x', is in the range, 0.35<x'<0.60, however, is epitaxially grown on a film such as of Cu having a face-centered cubic crystal structure or on a magnetoresistive film formed mainly of Fe, Co, or Ni or an alloy thereof, there can be formed an antiferromagnetic film which has a face-centered cubic crystal structure.

In the third exchange coupling film, the distribution of Fe concentration along the direction of film thickness of the antiferromagnetic film formed of an $(Ir_xMn_{1-x})_{100-y}Fe_y$ type alloy may be uniform or ununiform (composition-varied film). For example, the Fe concentration may be higher on the surface of the antiferromagnetic film or the interface with the ferromagnetic film or in the central part in the direction of thickness of the antiferromagnetic film.

Preferably, from the viewpoint of force of exchange coupling and corrosion resistance, however, the Fe concentration is high in the neighborhood of the interface between the antiferromagnetic film and the ferromagnetic film. As respects the manner of variation of the Fe concentration in the antiferromagnetic film, the variation may be continuous or stepwise.

Further, in the first, the second, and the third exchange coupling film according to this invention, the IrMn alloy which is used in the antiferromagnetic film may incorporate therein such additive components as Ni, Cu, Ta, Hf, Pd, Ti, Nb, Cr, Si, Al, W, Zr, Ga, Be, In, Sn, V, Mo, Re, Co, Ru, Rh, Pt, Ge, Os, Ag, Cd, Zn, Au, and N.

The antiferromagnetic film contemplated by this invention already acquires highly satisfactory corrosion resistance owing to the use of an IrMn alloy having such crystal structure and composition as described above, it is allowed to have the corrosion resistance improved further by the incorporation of such additive components.

If these additive components are incorporated in an unduly large amount, however, they will possibly degrade the force of exchange coupling of the exchange coupling film. Appropriately, therefore, the amount of the additive components to be incorporated is defined to be not more than 50 at % based on the composition represented by the general formula, $Ir_xMn_{100-x}$ ($2 \leq x \leq 80$). In the case of Cu, Ta, Hf. Ti, Nb, Cr, Si, Al, W, Zr, and Mo, this amount is properly not more than 30 at %. In the case of N, the amount is not more than 20 at %.

The same remarks hold good for the IrMnFe alloy in the third exchange coupling film. If the amount of the additive components to be incorporated exceeds 50 at %, the force of exchange coupling of the exchange coupling film will be unduly low.

Further in the exchange coupling film of this invention, the antiferromagnetic film which is formed of the IrMn alloy (inclusive of the IrMnFe alloy) advantageously is possessed at least partly of an ordered phase. This is because the Néel point is elevated by ordering the atomic arrangement of the antiferromagnetic film of the IrMn alloy, consequently the blocking temperature of the exchange coupling film is heightened and the reliability of this film is exalted and, at the same time, the force of exchange coupling between the antiferromagnetic film and the ferromagnetic film is augmented.

When the antiferromagnetic film is formed of an IrMn alloy having a face-centered cubic crystal structure as in the present invention, generally the antiferromagnetic film as deposited state predominantly has an unordered phase. By a heat treatment performed at a temperature in the approximate range of 100 to 300° C., however, the antiferromagnetic film is enabled to form an ordred phase, concretely an a $Cu_3Au$ type ordered phase. Here, the formation of this ordered phase can be easily confirmed by the X-ray diffraction analysis of the heat-treated film.

This invention does not particularly discriminate the ferromagnetic film on any account. In terms of the lattice matching property thereof with the antiferromagnetic film, however, it is properly a magnetoresistive film is preferable to form a face-centered cubic crystal structure or a hexagonal closest packing crystal structure. The magnetoresistive films for this description include anisotropic magnetoresistive films and giant magnetoresistive films such as artificial lattice films, spin valve films, and granular films, for example. Such magnetoresistive films as are mainly formed of an alloy containing at least one metal selected from among Fe, Co, and Ni are concrete examples. The ferromagnetic film is preferable to contain Fe. The Fe thus contained in the ferromagnetic film brings about the advantage of augmenting the force of exchange coupling between the ferromagnetic film and the antiferromagnetic film.

The magnetoresistive film which particularly has Co or a Co alloy as a main component thereof, when laminated on an antiferromagnetic film formed of an IrMn alloy having a face-centered cubic crystal structure, can form an exchange coupling film which has an enough high blocking temperature for a magnetic head application.

When an artificial lattice film or a spin valve film which has a multilayer structure including the combination such as of a Co type alloy magnetic film and a Cu nonmagnetic film is used as a magnetoresistive film, this magnetoresistive film is utilized highly advantageously for a magnetic head, for example, because it acquires a large rate of change in resistance and moreover exhibits good thermal stability.

Now, the thermal stability of the magnetoresistive film which is possessed of such a multilayer structure as mentioned above will be described further.

In a multilayer structure comprising a NiFe magnetic film and a Cu nonmagnetic film, for example, Ni and Cu form a solid solution in all composition range. When this multilayer structure is exposed to a temperature of about 200° C. as during the fabrication process of a magnetoresistive element, therefore, diffusion occurs between the NiFe magnetic film and the Cu nonmagnetic film and the rate of change in resistance of the magnetoresistive film is lowered inevitably. In contrast, in a multilayer structure comprising a Co type alloy magnetic film and a Cu nonmagnetic film, Co and Cu hardly form a solid solution region. Even when the magnetoresistive film is heated to about 350° C. during the course of fabrication of a magnetoresistive element, therefore, the rate of change in resistance of this film shows substantially no decline.

Optionally, this invention allows a ferromagnetic film made of Co or a Co type alloy to be inserted in the interface between a ferromagnetic film containing no Co and an antiferromagnetic film to heighten the blocking temperature of an exchange coupling film to be produced.

In this case, the ferromagnetic film containing no Co and a ferromagnetic film made of Co or a Co type alloy may be superposed severally on the opposite surfaces of an antiferromagnetic film.

Further, this invention allows the ferromagnetic film to incorporate therein additive components with a view to improving the magnetic properties of the ferromagnetic film and augmenting the lattice matching property of this film with an antiferromagnetic film made of an IrMn alloy.

From the same point of view, the ferromagnetic film made of a NiFe type alloy is allowed to incorporate therein additive components. In this case, the incorporated additive components need not be distributed throughout the whole volume of the ferromagnetic film but may properly be distributed at least in the proximity of the interface for the sake of augmenting the lattice matching property thereof with the antiferromagnetic film.

The thickness of the antiferromagnetic film in the present invention has no particular restriction except the requirement that it permit the film to manifest necessary antiferromagnetism. For the purpose of enabling the antiferromagnetic film to acquire large force of exchange coupling, the thickness of the antiferromagnetic film ought to be larger than that of the ferromagnetic film. From the viewpoint of ensuring the stability of the force of exchange coupling after the heat treatment, this thickness is appropriately not more than about 15 nm, or preferably not more than about 10 nm. Further, from the same view point the thickness of the ferromagnetic film is preferably less than about 3 nm. These antiferromagnetic film and ferromagnetic film are only required to form the exchange coupling by being at least partly laminated on each other.

Further, the thickness of the exchange coupling film of the invention is preferably more than about 3 nm, and the thickness of the ferromagnetic film to be pinned is preferably more than about 1 nm.

The exchange coupling film of this invention is formed on a substrate, for example, by any of the known film-forming methods such as, for example, the vacuum deposition method, sputtering method, and MBE method. In this case, for the purpose of imparting unidirectional anisotropy to the exchange coupling between the antiferromagnetic film and the ferromagnetic film, the exchange coupling film may be formed in a magnetic field or it may be heat-treated in a magnetic field. The heat treatment given herein is further effective in forming the ordered phase mentioned above.

When the ferromagnetic film contains Fe in this case, the Fe during the course of the heat treatment is diffused from the ferromagnetic film toward the antiferromagnetic film to form a diffused layer of Fe along the interface between the two films, with the result that the Fe concentration will be increased along the interface and the force of exchange coupling further augmented.

Incidentally, such diffusion of Fe from the ferromagnetic film toward the antiferromagnetic film as mentioned above may be utilized for forming an IrMnFe antiferromagnetic film of the third exchange coupling film according to this invention by laminating a ferromagnetic film and an IrMn film containing no Fe and then annealing the resultant laminated films. When a ferromagnetic film containing no Fe is used, an IrMnFe antiferromagnetic film may be formed by interposing a layer containing Fe as a main component between the ferromagnetic film containing no Fe and an IrMn antiferromagnetic film containing no Fe. The layer containing Fe as a main component and inserted in the interface as mentioned above properly has a thickness of not more than about 5 nm, preferably not more than about 2 nm. When a Fe layer having a thickness of not less than monoatomic layer is present in the interface between an IrMn film containing no Fe and a ferromagnetic film containing no Fe, it contributes to augment the force of exchange coupling.

By the same token, the insertion of such a Fe layer as mentioned above in the interface enables an IrMnFe layer to acquire an augmented force of exchange coupling even when the ferromagnetic film either contains no Fe or contains Fe only in a small amount. The Fe layer in this case manifests a necessary effect so long as it has a thickness of not less than monoatomic layer. If the Fe layer has a thickness exceeding about 5 nm, the force of exchange coupling will be unduly low.

A material of the substrate of the exchange coupling film of the present invention does not be particularly restricted. An amorphous substrate such as a glass or resin, a single crystal such as Si, MgO, $Al_2O_3$ or various ferrites, an orientation substrate and a sintered substrate may be used. Further, to improve the cristallinity of the antiferromagnetic film or the ferromagnetic film, an underlayer having a thickness of about 1 to 100 μm may be provided on the substrate. A material for forming the underlayer has no particular restriction except for the requirement that it is capable of improving the crystallinity of the antiferromagnetic film or the ferromagnetic film. A noble metal such as Pd or Pt, an amorphous metal such as CoZrNb, and a metal and alloy thereof having a face-centered cubic crystal structure may be used.

The magnetoresistive element of this invention comprises such an exchange coupling film as described above and an electrode adapted to feed an electric current to at least a ferromagnetic film of the exchange coupling film. As the raw material for this electrode, Cu, Ag, Al, and alloys thereof are available. The electrode may be formed in such a manner as to contact a ferromagnetic film either directly or through the medium such as of an antiferromagnetic film.

The exchange coupling film of this invention is provided with an exchange coupling film which is capable of producing such a large force of exchange coupling as mentioned above. Thus, it can be utilized for various devices such as magnetic field sensors and regenerating magnetic heads which make use of a magnetoresistive element.

In the magnetoresistive element of this invention, the force of exchange coupling between an antiferromagnetic film and a ferromagnetic film can be utilized not only for the control of magnetic domains of a magnetoresistive film which is a ferromagnetic film, namely the removal of Barkhausen noise from a magnetoresistive element, but also for allowing artificial lattice films and spin valve films as magnetoresistive film to be magnetically fasten ed.

DESCRIPTION OF THE PREFERRED EMBODIMENTS

Now, this invention will be described below with reference to working examples.

EXAMPLE 1

Figure 1:
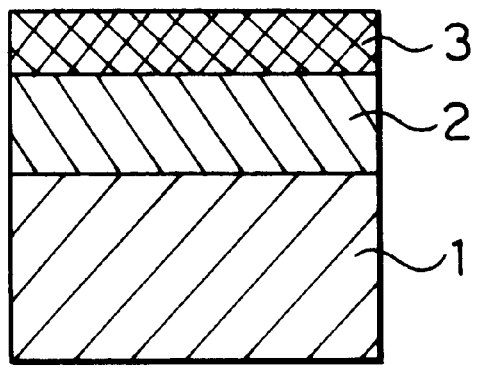
FIG. 1 is a longitudinal cross section of an exchange coupling film in Example 1 of this invention.

Exchange coupling films consisting of an antiferromagnetic film and a ferromagnetic film according to this invention were produced by using an RF magnetron sputtering method. The longitudinal cross section of such an exchange coupling film of this invention is shown in FIG. 1. Specifically, nine samples were obtained by first depositing on a sapphire c face substrate 1 a ferromagnetic film 2 of a composition of $Co_{81}Fe_9Pd_{10}$ in a thickness of 5 nm and then depositing thereon an antiferromagnetic film 3 of an IrMn alloy of a varying composition represented by the general formula of $Ir_xMn_{100-x}$ (x=1, 15, 25, 35, 45, 55, 65, 75, and 85) in a fixed thickness of 15 nm in a magnetic field. During the production, the substrate was not particularly given any heat treatment. When these exchange coupling films were analyzed by X-ray diffraction as to crystal structure and direction of orientation, their ferromagnetic films 2 and antiferromagnetic films 3 were found both to form a face-centered cubic crystal structure and have a (111) orientation.

Figure 2:
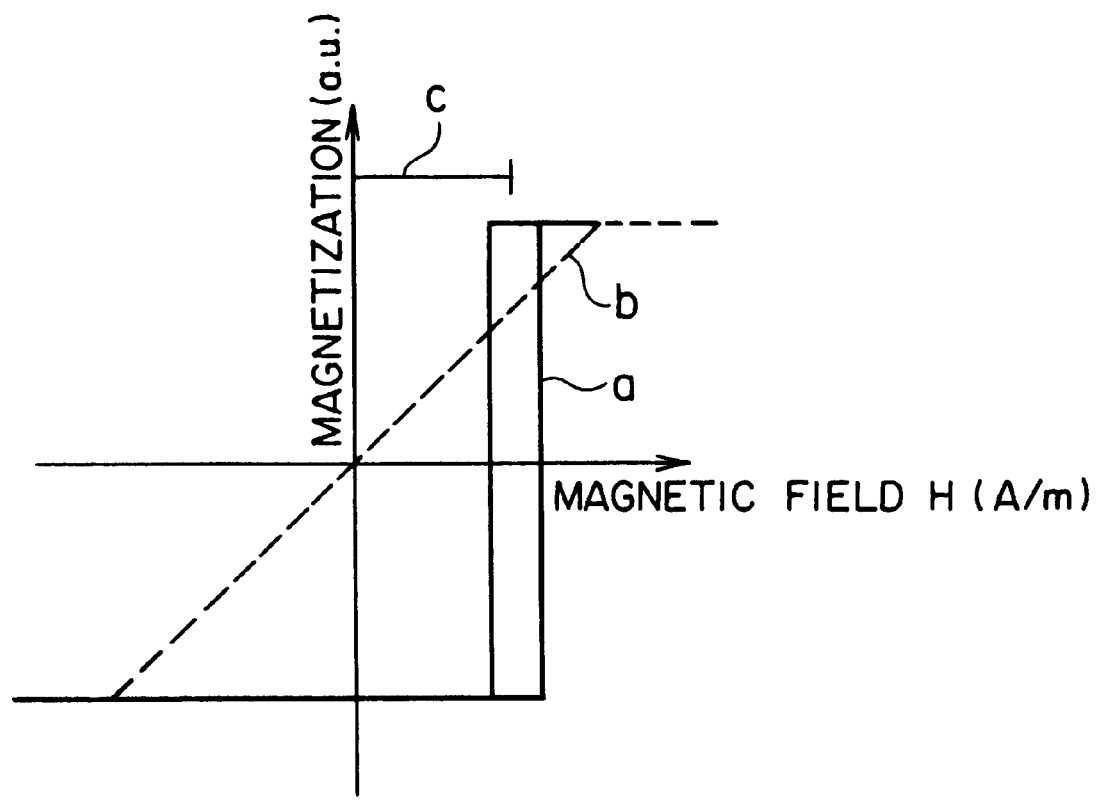
FIG. 2 is a characteristic diagram showing a curve of magnetization of the exchange coupling film.
Figure 3:
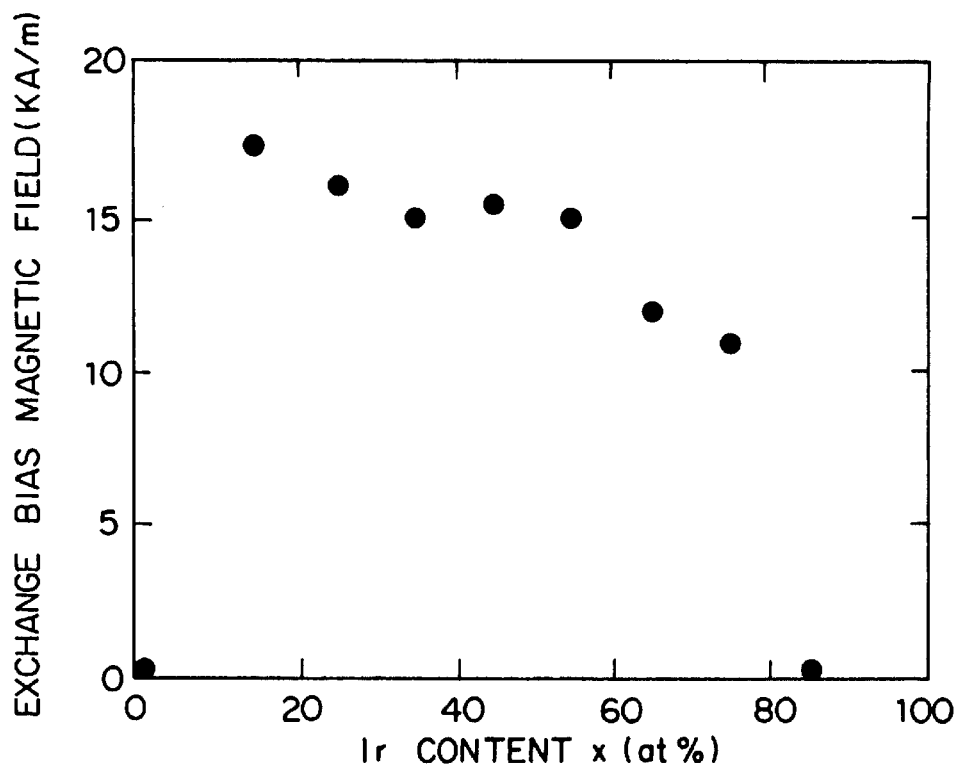
FIG. 3 is a diagram showing the dependency of the exchange bias magnetic field, Hua, of the exchange coupling film in Example 1 on the IrMn alloy composition.

The curves of an easy axis direction a (direction of magnetic field during film formation) and a hard axis direction b are shown in FIG. 2 for the produced exchange coupling films. In the diagram, the value of c represents the exchange bias magnetic field (Hua). The dependency of this Hua on the IrMn alloy composition is shown in FIG. 3. It is clearly noted from FIG. 3 that of the samples obtained herein, the exchange coupling films using an antiferromagnetic film of an IrMn alloy whose composition having an Ir content satisfying the expression, $2 \leq x \leq 80$ were invariably possessed of a fully satisfactory exchange bias magnetic field.

In the exchange coupling films of the same construction using a γ-FeMn alloy for the antiferromagnetic film thereof, the Hua of $Fe_{50}Mn_{50}$ showed the highest Hua of about in the FeMn system was 14 kA/m. The data indicate that the exchange coupling films of this invention obtained greater force of exchange coupling than the films containing an antiferromagnetic film of a γ-FeMn alloy.

Figure 4:
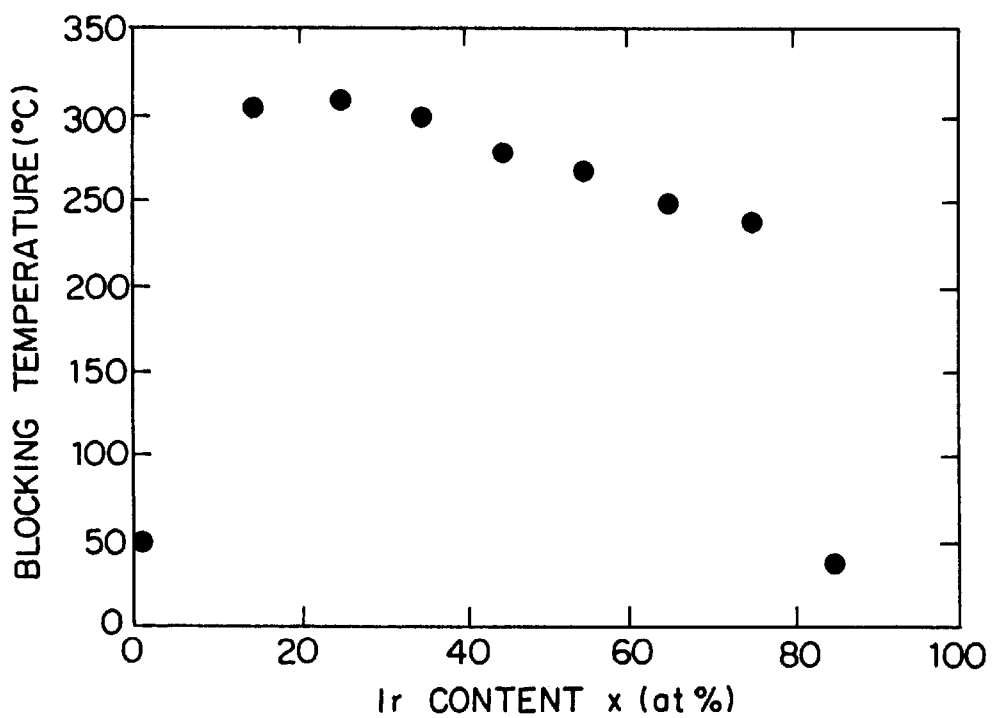
FIG. 4 is a diagram showing the dependency of the blocking temperature of the exchange coupling film in Example 1 on the IrMn alloy composition.

Their blocking temperature of the exchange coupling films were examined. The results are shown as reduced to dependency on the IrMn alloy composition in FIG. 4 similarly to the data of FIG. 3. It is remarked from FIG. 4 that the exchange coupling films of this invention which were found to possess a fully satisfactory exchange bias magnetic field as shown in FIG. 3 showed blocking temperatures exceeding 200° C. and consequently satisfactory reliability. In contrast, the exchange coupling film using a γFeMn alloy for its antiferromagnetic film was found to have a blocking temperature of 190° C., a value not enough to afford lasting reliability.

EXAMPLE 2

The exchange coupling film samples were produced by following the procedure of Example 1 while depositing on a Si (100) substrate having the surface coated with a thermally oxidized $SiO_2$ film an antiferromagnetic film made of an IrMn alloy having a varying composition represented by the general formula, $Ir_x$—$Mn_{100-x}$ (x=1, 15, 25, 35, 45, 50, 55, 65, 76, and 85), in a thickness of 15 nm and a ferromagnetic film of a composition of $Co_{81}Fe_9Pd_{10}$ in a thickness of 5 nm in the order mentioned.

When these exchange coupling films were analyzed by X-ray diffraction to determine their crystal structures. It was found that the antiferromagnetic films made of IrMn alloys having Ir contents, x, of 45, 50, and 55 formed a face-centered tetragonal crystal structure and the other antiferromagnetic films a face-centered cubic crystal structure.

Figure 5:
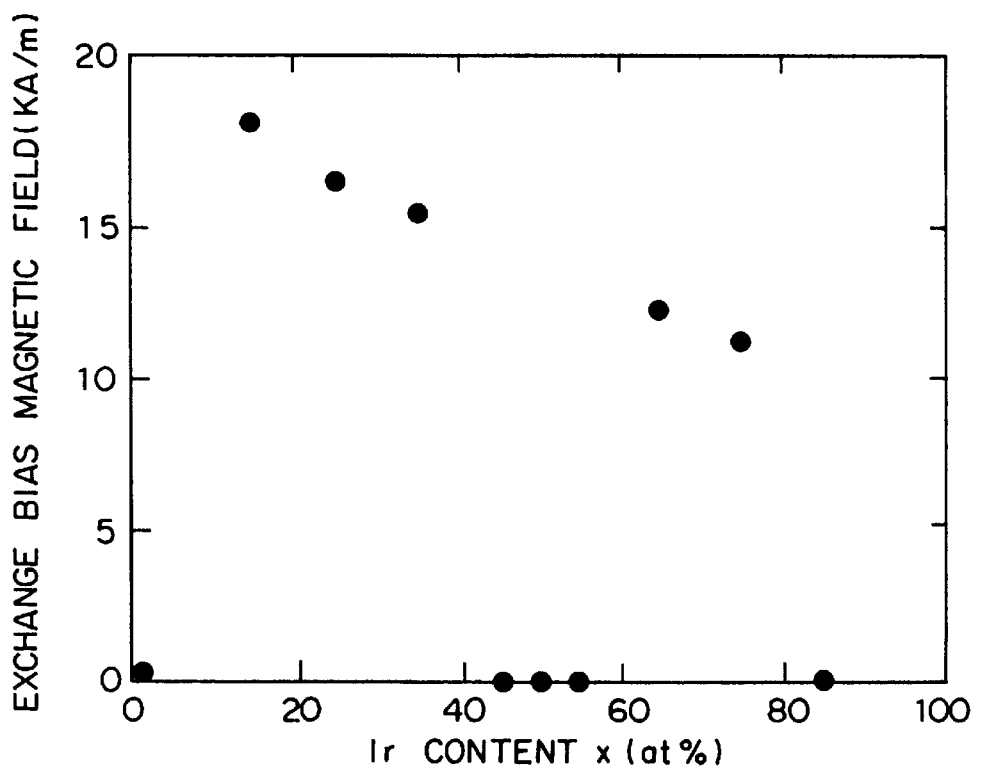
FIG. 5 is a diagram showing the dependency of the exchange bias magnetic field, Hua, of an exchange coupling film in Example 2 on the IrMn alloy composition.
Figure 6:
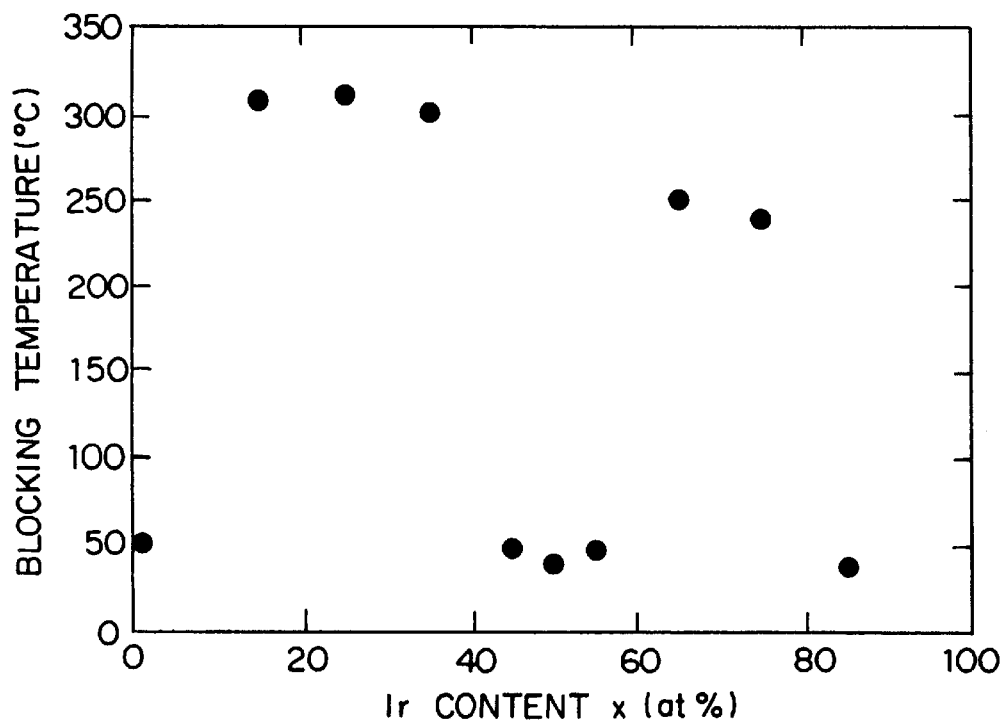
FIG. 6 is a diagram showing the dependency of the blocking temperature of the exchange coupling film in Example 2 on the IrMn alloy composition.

The produced exchange coupling films were tested, in the same manner as in Example 1, for dependency of the exchange bias magnetic field (Hua) and the blocking temperature on the IrMn alloy composition. The results are shown in FIG. 5 and FIG. 6. It is clearly noted from these diagrams that in the samples using in their antiferromagnetic films IrMn alloys so composed as to have Ir atomic % contents, x, in the range of $2 \leq x \leq 80$, the samples forming a face-centered tetragonal crystal structure and using IrMn alloys so composed as to have Ir atomic % contents, x, of 45, 55, and 55 showed marked decreased exchange bias magnetic field and blocking temperature.

Particularly the IrMn alloys having compositions represented by the general formula, $Ir_xMn_{100-x}$ ($2 \leq x \leq 35$, $60 \leq x \leq 80$), were found to form a face-centered cubic crystal structure more readily than those having Ir atomic % contents, X, in the range of 35<x<60. The data indicate that these IrMn alloys can be advantageously used for an antiferromagnetic film in the exchange coupling film of this invention.

EXAMPLE 3

Eight exchange coupling film samples were produced by following the procedure of Example 1 while causing the antiferromagnetic films possessed of a face-centered cubic crystal structure and made of an IrMn alloy of a composition of $Ir_{25}Mn_{75}$ to incorporate in the IrMn alloy thereof Ni, Cu, Ta, Hf, Pd, Ti, Nb, and Cr in a fixed concentration of 10 at %.

Subsequently, these exchange coupling films were tested for corrosion resistance. This test was carried out by allowing a sample to stand overnight in water and examining the sample as to the ratio of occurrence of corrosion pits.

Figure 7:
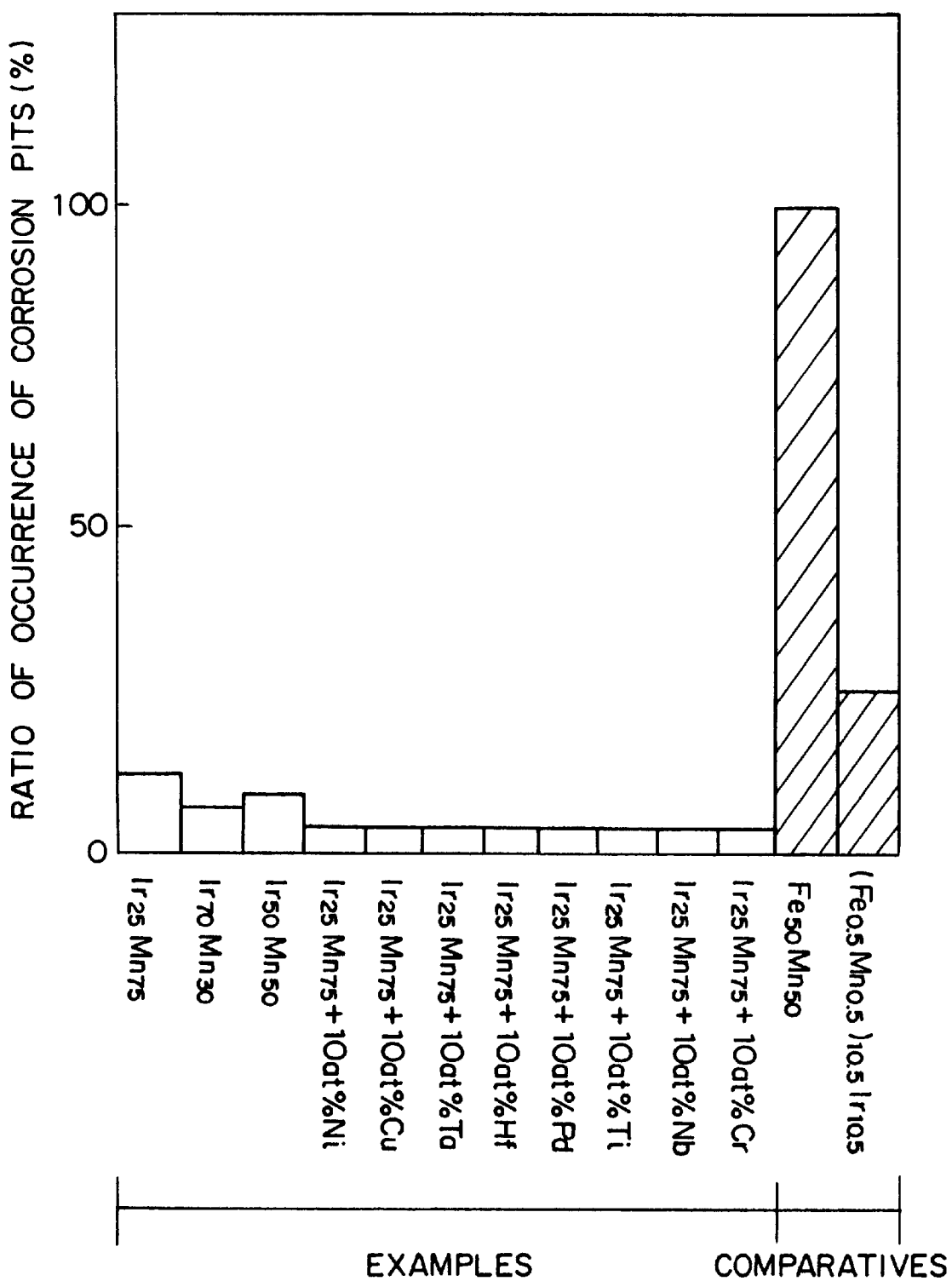
FIG. 7 is a diagram showing the ratio of occurrence of corrosion pits in the exchange coupling film in Example 3 of this invention.

The test results are shown in FIG. 7. In FIG. 7, the results of the test for corrosion resistance performed on those of the exchange coupling films produced in Example 1 which used IrMn alloys of the compositions of $Ir_{25}Mn_{75}$, $Ir_{70}Mn_{30}$, and $Ir_{50}Mn_{50}$ for antiferromagnetic films and the samples for comparison which used alloys of compositions of $Fe_{50}Mn_{50}$ and $(Fe_{0.5}Mn_{0.5})_{89.5}Ir_{10.5}$ in the place of IrMn alloy for antiferromagnetic films are additionally shown.

It is clearly noted from FIG. 7 that the samples provided with antiferromagnetic films having an IrMn alloy as a main component had very low ratios of occurrence of corrosion pits as compared with the samples provided with antiferromagnetic films using a FeMn type alloy and that the samples incorporating the additive components mentioned above in the IrMn alloy had further decreased ratios of occurrence of corrosion pits.

The exchange coupling film which used an IrMn alloy of the composition of $Ir_{25}Mn_{75}$ mentioned above for an antiferromagnetic film and exchange coupling films which used IrMn alloys having the same composition of $Ir_{25}Mn_{75}$ and further incorporating therein Ni, Cu, Ta, Hf. Pd. Ti, Nb, and Cr each in a fixed ratio of 10 at % were tested as deposited for exchange bias magnetic field Hua and blocking temperature in the same manner as in Example 1.

Figure 8:
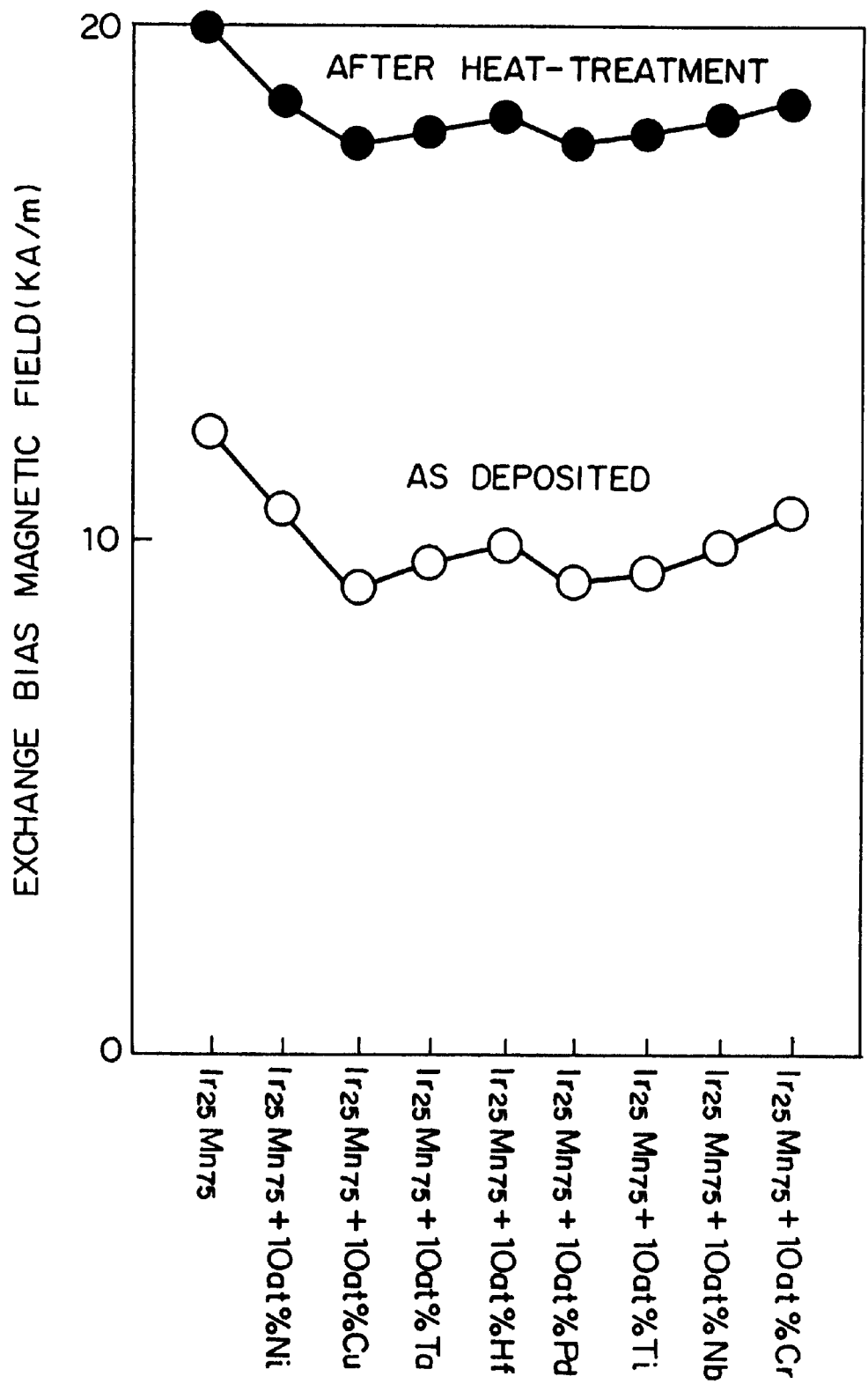
FIG. 8 is a diagram showing the dependency of the exchange bias magnetic field, Hua, of an exchange coupling film in Example 3 on the IrMn alloy composition.
Figure 9:
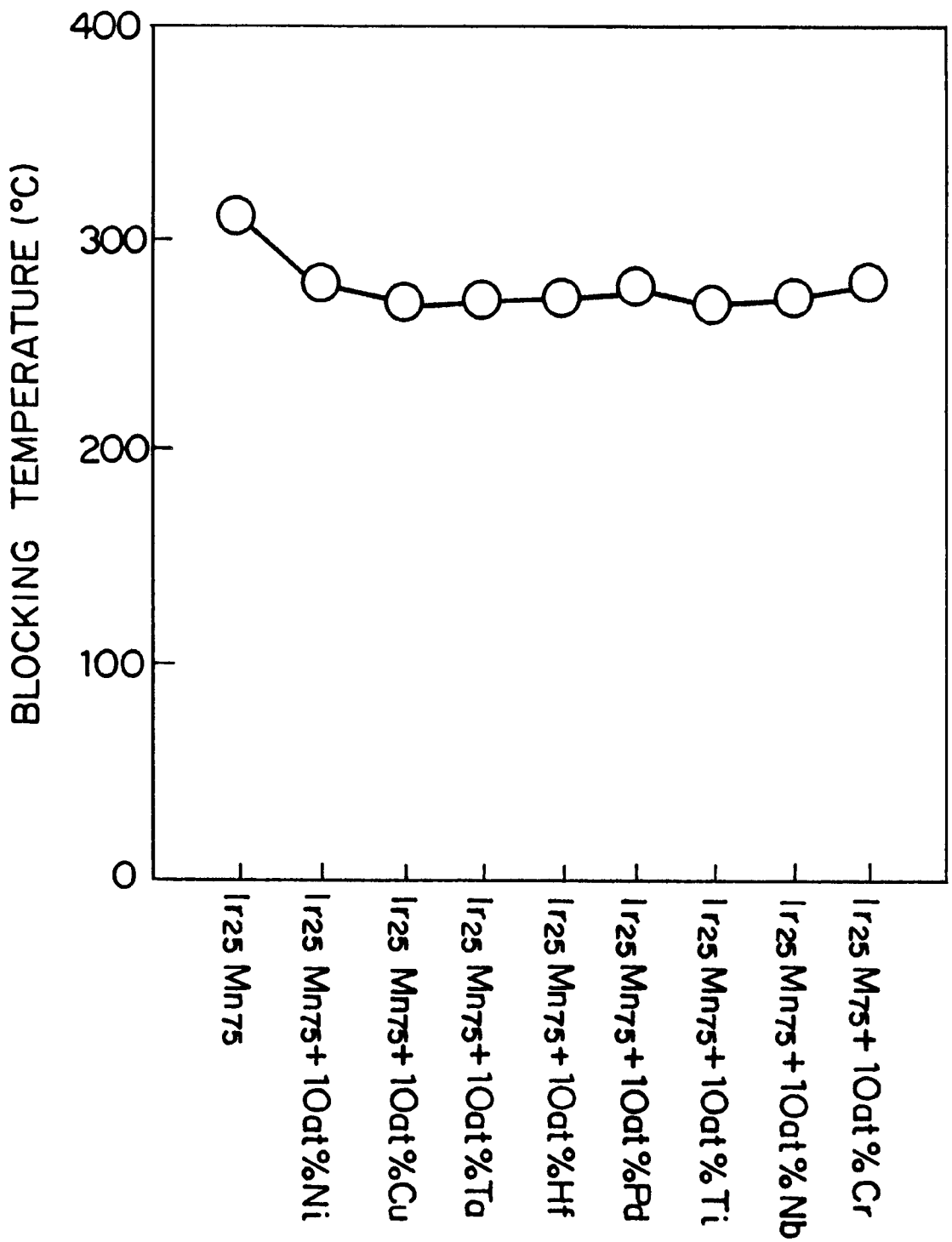
FIG. 9 is a diagram showing the dependency of the blocking temperature of the exchange coupling film in Example 3 on the IrMn alloy composition.

The results of the test are shown in FIG. 8 and FIG. 9. It is clearly noted from the diagrams that these samples showed perfect reliability as evinced by fully satisfactory exchange bias magnetic fields and high blocking temperatures. To be specific, the exchange coupling films of Example 1 acquired improved corrosion resistance and showed practically no sign of decline in force of exchange coupling or reliability when the IrMn alloys used in their antiferromagnetic films had additive components incorporated therein.

The exchange bias magnetic fields, Hua, of these exchange coupling films which were found after the films had been heat-treated in a vacuum at 200° C. for three hours are additionally shown in FIG. 8. It is clearly noted from FIG. 8 that the heat treatment markedly heightened the exchange bias magnetic fields of all the samples from the exchange bias magnetic fields exhibited by the same samples in their as deposited state.

The results of the analysis by X-ray diffraction show that, in the heat-treated exchange coupling films, a peak due to an ordered phase appeared in the X-ray diffraction peaks of the antiferromagnetic films showing a face-centered cubic crystal structure. This fact indicates that the heat treatment formed an ordered phase in the antiferromagnetic films made of IrMn alloys and imparted augmented forces of exchange coupling to the films.

EXAMPLE 4

Exchange coupling films were formed by superposing a ferro-magnetic film of a varying composition of $(Co_{0.9}Fe_{0.1})_{100-x}Pd_x$ and an antiferromagnetic film of a composition of $Ir_{25}Mn_{75}$ in completely the same manner as in Example 1.

These exchange coupling films were found to have exchange bias magnetic fields, Hua, of about 15 kA/m.

The ferromagnetic films of these exchange coupling films had their Pd contents, x, varied in the range of 0 to 20 at %. These ferromagnetic films were tested for force of exchange coupling. The results indicate that the magnitudes of exchange bias magnetic field were found to increase in proportion as the values of Pd content increased.

EXAMPLE 5

Figure 10:
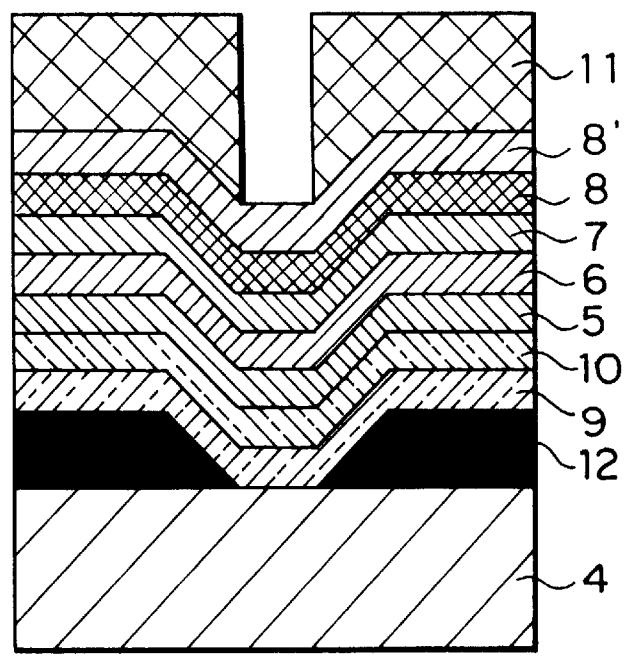
FIG. 10 is a longitudinal cross section of a magnetoresistive element in Example 5 of this invention.

A magnetoresistive element according to this invention was produced by using an exchange coupling film which consisted of an antiferromagnetic film made of an IrMn alloy having a face-centered cubic crystal structure and a composition of $Ir_{25}Mn_{75}$ and a ferromagnetic film. FIG. 10 is a longitudinal cross section of this magnetoresistive element.

A substrate 4 which was a Si wafer having the surface thereof thermally oxidized, ferromagnetic films 5 and 7 which were $Co_{90}Fe_{10}$ films measuring respectively 3 nm and 2 nm in thickness, an antiferromagnetic film 8 which was an $Ir_{25}Mn_{75}$ film 8 nm in thickness, and a nonmagnetic film 6 which was a Cu film 3 nm in thickness were formed. In the diagram, high-resistance soft magnetic films 9 and 10 were respectively a $Co_{88}Zr_5Nb_7$ film 10 nm in thickness and a $Ni_{80}Fe_{20}$ film 2 nm in thickness, an electrode 11 was a Cu film 0.1 $\mu$m in thickness, a hard film 12 was a $Co_{83}Pt_{17}$ film 40 nm in thickness, and a protective film 8' was a Ti film 20 nm in thickness.

The $Co_{90}Fe_{10}$ films which were formed herein formed the same face-centered cubic crystal structure as the ferromagnetic film of the composition of $Co_{81}Fe_9Pd_{10}$ in the exchange coupling film in Example 1.

In the manufacture of the magnetoresistive element, the ferromagnetic films 5 and 7, the nonmagnetic film 6, and the antiferromagnetic film 8 were formed in a magnetic field and they were subjected to a heat treatment also in a magnetic field to impart unidirectional anisotropy to the exchange coupling between the antiferromagnetic film 8 and the ferromagnetic film 7.

The high-resistance soft magnetic film 9 likewise was formed in a magnetic field and then subjected to a heat treatment to be vested with uniaxial magnetic anisotropy and, meanwhile, the hard film 12 was magnetized to exalt further this uniaxial magnetic anisotropy.

The heat treatment was formed by the annealing condition that heating at 250° C. for 1 hour in the static magnetic field which was applied the magnetic field in the direction of axis of easy magnetization of the lower magnetic layer was carried, and subsequently cooling in the oven was carried out. At 210° C. during the cooling in the oven, the direction of the applied magnetic field was turned to the perpendicular direction of axis of easy magnetization.

Finally, the laminated films were manufactured into an element by following the conventional semiconductor process with necessary modifications, to obtain the magnetoresistive element of this invention.

When this magnetoresistive element was exposed to an externally applied magnetic field and then tested for responsivity to magnetic field, it was found to yield a more stable output than the magnetoresistive element using a $\gamma$-FeMn alloy for an antiferromagnetic film and generate no perceptible Barkhausen noise attendant on a wall movement.

Owing to the fact that the antiferromagnetic film exhibited better heat resistance than the antiferromagnetic film made of a $\gamma$-FeMn alloy and the fact that the exchange coupling film had a high blocking temperature and a large force of exchange coupling, the magnetoresistive element of high sensitivity capable of yielding a stable output could be manufactured with a high yield.

EXAMPLE 6

A magnetoresistive element according to this invention was produced by using an exchange coupling film which consisted of an antiferromagnetic film made of an IrMn alloy having a face-centered cubic crystal structure and a composition of $Ir_{20}Mn_{80}$ and a ferromagnetic film. FIG. 10 is a longitudinal cross section of this magnetoresistive element.

A substrate 4 which was a Si wafer having the surface thereof thermally oxidized, ferromagnetic films 5 and 7 which were $Co_{90}Fe_{10}$ films measuring respectively 3 nm and 2 nm in thick-ness, an antiferromagnetic film 8 which was an $Ir_{20}Mn_{80}$ film 8 nm in thickness, and a nonmagnetic film 6 which was a Cu film 3 nm in thickness were formed. In the diagram, high-resistance soft magnetic films 9 and 10 were respectively a $Co_{88}Zr_5Nb_7$ film 10 nm in thickness and a $Ni_{80}Fe_{20}$ film 2 nm in thickness, an electrode 11 was a Cu film 0.1 $\mu$m in thickness, a hard film 12 was a $Co_{83}Pt_{17}$ film 40 nm in thickness, and a protective film 8' was a Ta film 20 nm in thickness.

The $Co_{90}Fe_{10}$ films which were formed herein formed the same face-centered cubic crystal structure as the ferromagnetic film of the composition of $Co_{81}Fe_9Pd_{10}$ in the exchange coupling film in Example 1.

In the manufacture of the magnetoresistive element, the ferromagnetic films 5 and 7, the nonmagnetic film 6, and the antiferromagnetic film 8 were formed in a magnetic field and they were subjected to a heat treatment also in a magnetic field to impart unidirectional anisotropy to the exchange coupling between the antiferromagnetic film 8 and the ferromagnetic film 7.

The high-resistance soft magnetic film 9 likewise was formed in a magnetic field and then subjected to a heat treatment to be vested with uniaxial magnetic anisotropy and, meanwhile, the hard film 12 was magnetized to exalt further this uniaxial magnetic anisotropy. The annealing conditions were the same as in Example 5. Finally, the superposed films were manufactured into an element by following the conventional semiconductor process with necessary modifications, to obtain the magnetoresistive element of this invention.

When this magnetoresistive element was exposed to an externally applied magnetic field and then tested for responsivity to magnetic field, it was found to yield a more stable output than the magnetoresistive element using a $\gamma$-FeMn alloy for an antiferromagnetic film and generate no perceptible Barkhausen noise attendant on a shift of domain wall.

Owing to the fact that the antiferromagnetic film exhibited better heat resistance than the ferromagnetic film made of a $\gamma$-FeMn alloy and the fact that the exchange coupling film had a high blocking temperature and a large force of exchange coupling, the magnetoresistive element of high sensitivity capable of yielding a stable output could be manufactured with a high yield.

Magnetoresistive elements were prepared by faithfully following the procedure described above and they were tested for sensitivity and reliability. Specifically, three samples of magnetoresistive element respectively using ferromagnetic films 5 and 7 which were both a $Co_{90}Fe_{10}$ film, ferromagnetic films 5 and 7 which were both a $Ni_{80}Fe_{20}$ film, and ferromagnetic films 5 and 7 which were respectively a $Ni_{80}Fe_{20}$ film and a $Co_{90}Fe_{10}$ film were prepared and were tested for ratio of change in resistance per unit magnetic field, that is, sensitivity and for the diffusion starting temperature at which diffusion between the ferro-magnetic films 5 and 7 and the nonmagnetic film 6 starts under application of heat.

Figure 11:
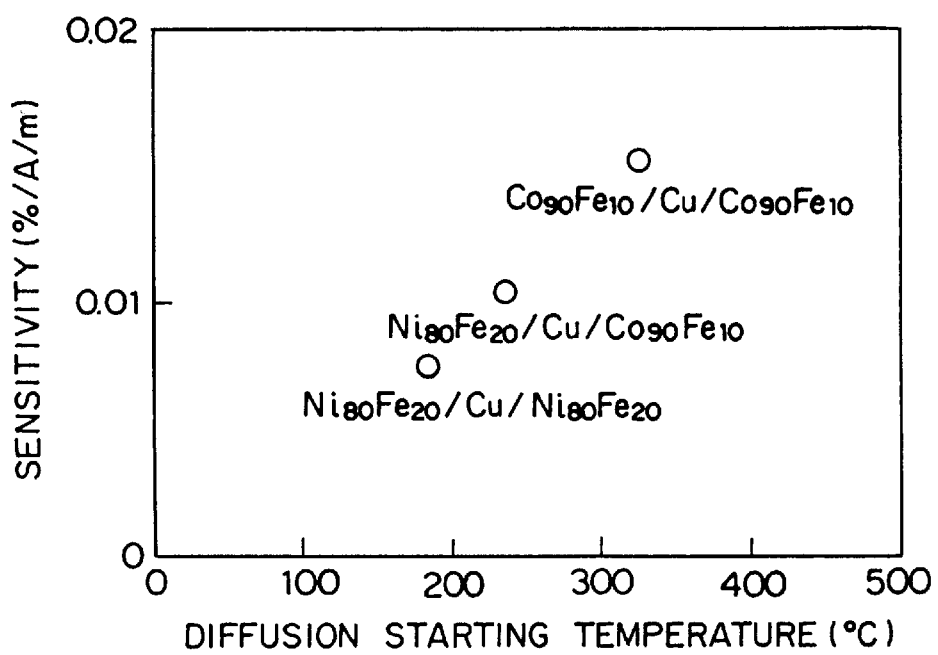
FIG. 11 is a diagram showing the ratio of change in resistance (sensitivity) and the diffusion starting temperature of the magnetoresistive element in Example 5.

The results are shown in FIG. 11.

It is clear from FIG. 11 that the use of CoFe alloys for ferromagnetic films 7 resulted in augmenting ratio of change in resistance and (sensitivity) diffusion starting temperature. The exchange coupling films obtained by laminating ferromagnetic films 7 made of a CoFe alloy on antiferromagnetic films were found to have blocking temperatures about 40 to 50° C. higher than those of the exchange coupling films using ferromagnetic films 7 made of a NiFe alloy. This fact indicates that this invention, owing to the use of a Co type alloy having a face-centered cubic crystal structure for a ferromagnetic film, permits production of a magnetoresistive element which excels particularly in sensitivity, lasting reliability, and yield of production.

Further, when NiFe is used as the ferromagnetic films 5, an annealing temperature at the annealing in the perpendicular direction which is required as an element can be set to be high. Thus, it become possible to produce enough of the characteristics of the IrMn type film having a high blocking temperature.

EXAMPLE 7

Exchange coupling films each consisting of an antiferromagnetic film and a ferromagnetic film in a construction shown in FIG. 1 were produced by depositing the component films in a magnetic field in such a manner as to avoid heating a substrate by the use of a RF magnetron sputter device. Specifically, a ferromagnetic film 2 of $Co_{90}Fe_{10}$ 5 nm in thickness and an antiferromagnetic film 3 of $(Ir_{0.25}Mn_{0.75})_{100-y}Fe_y$ 25 nm in thickness were sequentially deposited in the order mentioned on a sapphire substrate 1 having a C surface. In the samples of this example, the Fe content by atomic % in the antiferromagnetic film 3 was set at such varying values of 0, 5, 10, 15, 20, 25, 30, 35, 40, 50, 60, and 70.

The exchange coupling films thus obtained were analyzed by X-ray diffraction to determine their crystal structures and directions of orientation. The results confirm that the antiferromagnetic films and the ferromagnetic films both had a face-centered cubic crystal structure and an orientation of (111).

Then, the exchange coupling films were tested for exchange bias magnetic field as a criterion of force of exchange coupling, blocking temperature, and ratio of occurrence of corrosion pits after standing overnight in water as a criterion of corrosion resistance.

Figure 12:
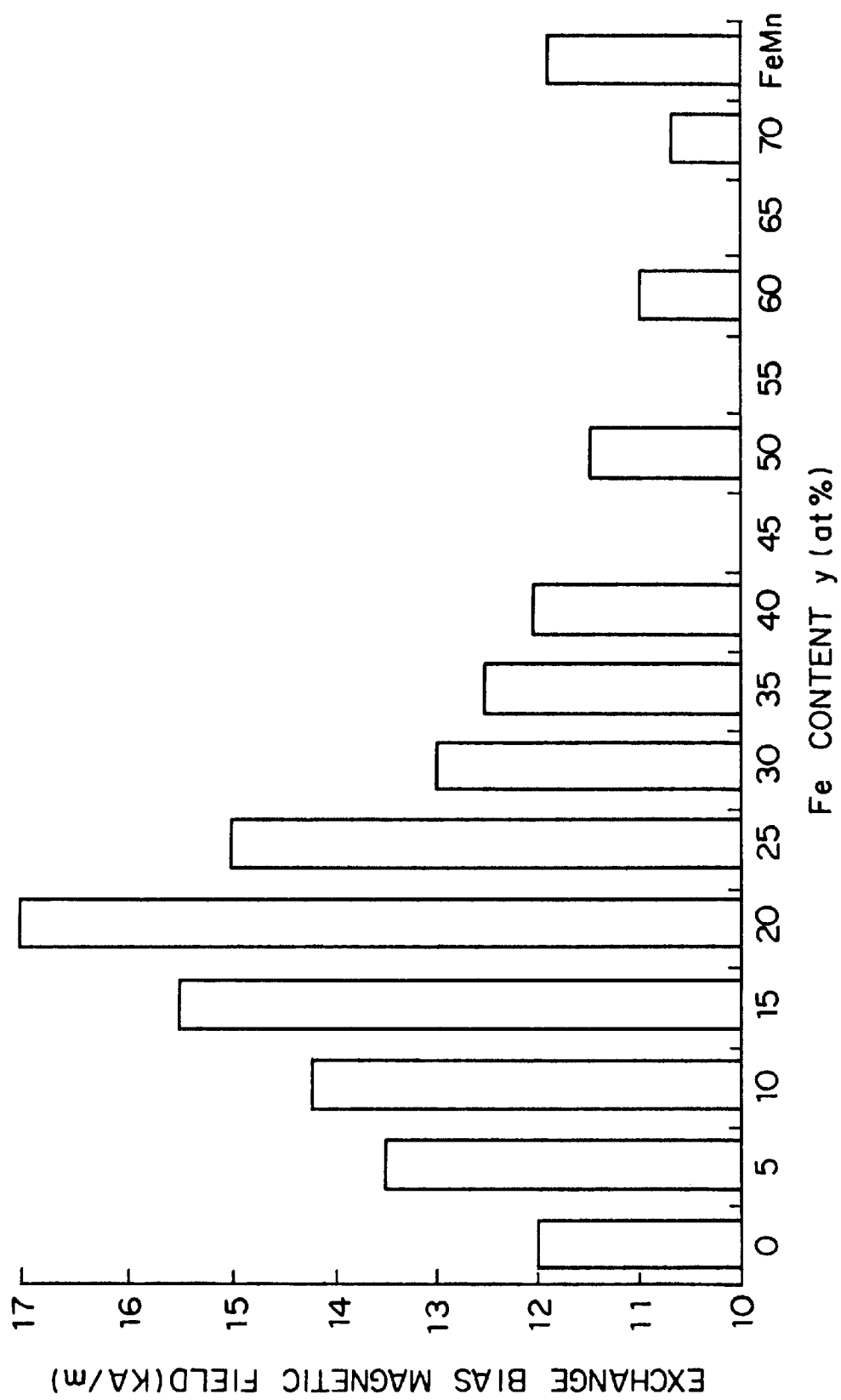
FIG. 12 is a diagram showing the relation between the exchange bias magnetic field, Hua, of an exchange coupling film in FIG. 6 and the Fe content in an IrMnFe alloy.
Figure 13:
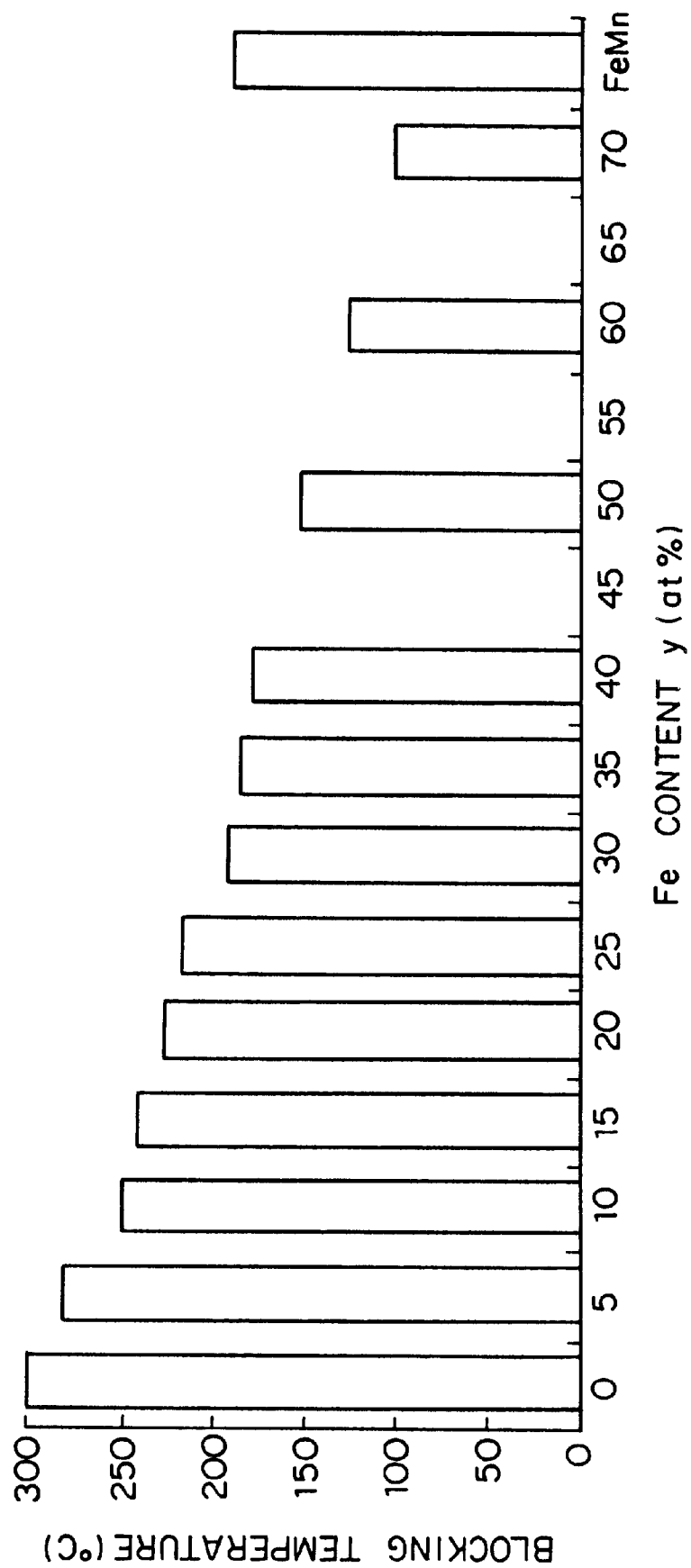
FIG. 13 is a diagram showing the relation between the blocking temperature of the exchange coupling film in FIG. 6 and the Fe content in an IrMnFe alloy.
Figure 14:
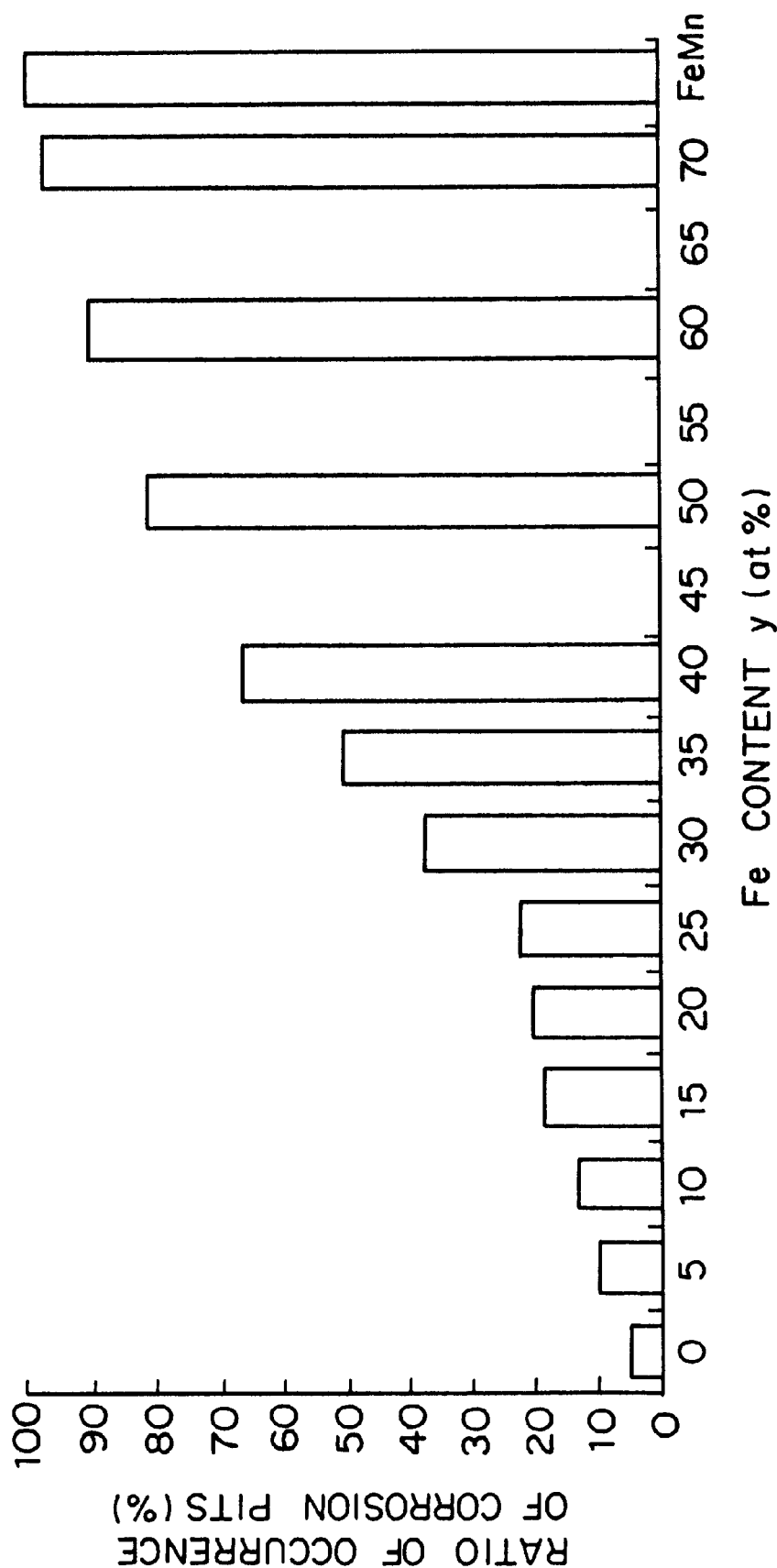
FIG. 14 is a diagram showing the relation between the ratio of occurrence of corrosion pits in the exchange coupling film in FIG. 6 and the Fe content in an IrMnFe alloy.

FIG. 12 shows the relation between the Fe content, y, and the exchange bias magnetic field of the $(Ir_{0.25}Mn_{0.75})_{100-y}Fe_y$ alloy forming the antiferromagnetic film 3, FIG. 13 the relation between the Fe content, y, and the blocking temperature, and FIG. 14 the relation between the Fe content, y, and the ratio of occurrence of corrosion pits. For comparison, the results similarly obtained of an exchange coupling film using $\gamma$-FeMn for an antiferromagnetic film are shown in these diagrams.

As shown in FIG. 12, the exchange bias magnetic field reached a peak value when the Fe content, y, was 20 at % and it was larger than that in the antiferromagnetic film made of an $\gamma$-FeMn alloy when the Fe content, Y, was in the range of 0<y<40.

The blocking temperature, as shown in FIG. 13, rose in proportion as the Fe content, y, decreased and was higher than that in the antiferromagnetic film made of a γ-FeMn alloy when the Fe content was smaller than 30.

The corrosion resistance, as shown in FIG. 14, gained in quality in proportion as the Fe content, y, decreased and was better than that in the antiferromagnetic film made of a γ-FeMn alloy irrespectively of the Fe content, y.

From these results, it is inferred that the exchange coupling film to be produced excels in all the properties including force of exchange coupling, blocking temperature, and corrosion resistance when the Fe content, y, of the antiferromagnetic film is in the range of 0<y<30.

Similar results were obtained in the case of an exchange coupling film using an antiferromagnetic film of an $(Ir_{x'}Mn_{1-x'})_{100y}Fe_y$ alloy wherein the value of x' was other than 0.25.

EXAMPLE 8

Figure 15:
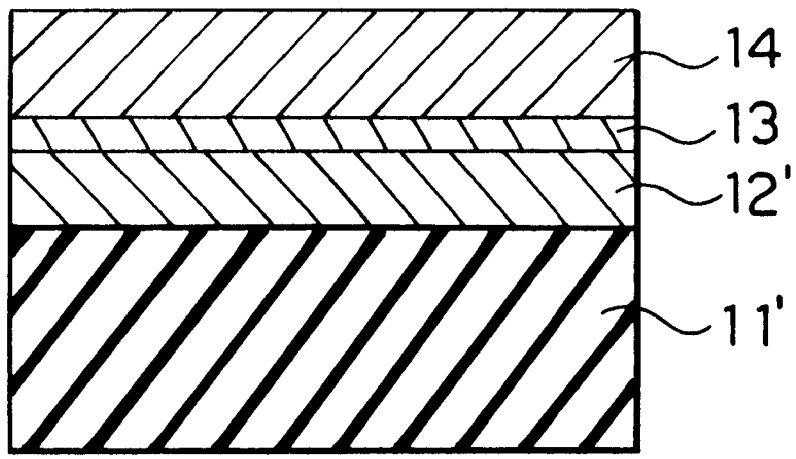
FIG. 15 is a longitudinal cross section of an exchange coupling film in Examples 7 and 8 of this invention.

An exchange coupling film having a construction shown in FIG. 15 was produced by depositing component films in a magnetic field in such a manner as to avoid heating a substrate by using a RF magnetron sputtering method. Specifically, a ferromagnetic film 12 of Co 5 nm in thickness, a film 13 of Fe 1 nm in thick-ness, and an antiferromagnetic film 14 of $Ir_{25}Mn_{75}$ 15 nm in thickness were sequentially superposed in the order mentioned on a sapphire substrate 11 having a C surface. During the course of the film formation, the sample still in process of production was tested for exchange bias magnetic field and blocking temperature.

Then, the sample was heat-treated in a vacuum at 290° C. for 5 hours in a magnetic field. At this stage, it was again tested for exchange bias magnetic field and blocking temperature.

The produced exchange coupling film was analyzed by the Auger spectrometric method to determine the distribution of composition in the direction of film thickness. The results confirm that the Fe concentration in the antiferromagnetic film 14 increased toward the interface thereof with the Fe layer 13 the Fe was diffused from the Fe layer 13 toward the antiferromagnetic film 14. The produced antiferromagnetic film 14 was found to have a composition of $(Ir_{0.25}Mn_{0.75})_{92}Fe_8$.

Table 1 shows the results of the test for exchange bias magnetic field and blocking temperature performed before and after the heat treatment. Table 1 additionally shows the results similarly obtained of an exchange coupling film which was produced by laminating a Co ferromagnetic film on a γ-FeMn antiferromagnetic film.

It is clearly noted from Table 1 that the exchange coupling film after the heat treatment showed a large exchange bias magnetic field and a very high blocking temperature as compared with the exchange coupling film using a γ-FeMn antiferromagnetic film. Similar results were obtained in the case of an exchange coupling film using an antiferromagnetic film of an $Ir_{x'}Mn_{1-x'}$ alloy wherein the value of x' was other than 0.25.

TABLE 1

| | | Exchange bias magnetic field, A/m | Blocking temperature, ° C. |
|---|---|---|---|
| | γ-FeMn | 10500 | 170 |
| Example 9 | Before heat treatment | 13000 | 300 |

TABLE 1-continued

| | Exchange bias magnetic field, A/m | Blocking temperature, ° C. |
|---|---|---|
| After heat treatment | 14500 | 270 |

EXAMPLE 9

An exchange coupling film having a construction shown in FIG. 15 was produced by depositing component films in a magnetic field in such a manner as to avoid heating a substrate by using a RF magnetron sputtering method. Specifically, a ferromagnetic film 12' of Co 5 nm in thickness, a film 13 of Fe 1 nm in thickness, and an antiferromagnetic film 14 of $(Ir_{0.25}Mn_{0.75})_{80}Fe_{20}$ 15 nm in thickness were sequentially deposited in the order mentioned on a sapphire substrate 11' having a C plane. The exchange coupling film thus obtained was tested for exchange bias magnetic field and blocking temperature.

Table 2 shows the results of the test for exchange bias magnetic field and blocking temperature performed in the presence and in the absence of the Fe layer 13. For comparison, this table additionally shows the results of the test similarly performed on an exchange coupling film produced by depositing a Co ferromagnetic film on a γ-FeMn antiferromagnetic film.

It is clearly noted from Table 2 that the force of exchange coupling increased in the presence of the Fe layer 13 even before the heat treatment and it increased further after the heat treatment. Further, the exchange bias magnetic field was large and the blocking temperature was notably high as compared with those of the exchange coupling film using a γ-FeMn antiferromagnetic film.

Similar results were obtained in the case of an exchange coupling film using an antiferromagnetic film of an $Ir_{x'}Mn_{1-x'}$ alloy wherein the value of x' was other than 0.25.

TABLE 2

| | | Exchange bias magnetic field, A/m | Blocking temperature, ° C. |
|---|---|---|---|
| | γ-FeMn | 10500 | 170 |
| Example 8 | Presence of Fe layer | 15000 | 250 |
| | Absence of Fe layer | 13000 | 220 |

EXAMPLE 10

Figure 16:
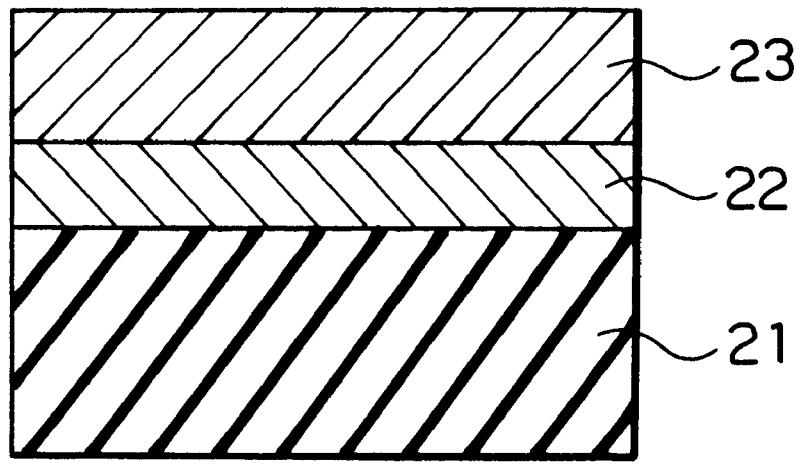
FIG. 16 is a longitudinal cross section of an exchange coupling in Example 9 of this invention.

An exchange coupling film having a construction shown in FIG. 16 was produced by superposing component films in a magnetic field in such a manner as to avoid heating a substrate by the use of a RF magnetron sputter device. Specifically, a ferromagnetic film 22 of $Co_{90}Fe_{10}$ 5 nm in thickness and an antiferromagnetic film 23 of $Ir_{25}Mn_{75}$ 15 nm in thickness were sequentially deposited in the order mentioned on a sapphire substrate 21 having a C surface. During the course of the film formation, the sample still in process of production was tested for exchange bias magnetic field and blocking temperature.

Then, the sample was heat-treated in a vacuum at 290° C. for 5 hours in a magnetic field. At this stage, it was again tested for exchange bias magnetic field and blocking temperature.

The produced exchange coupling film was analyzed by the Auger spectrometric method to determine the distribution of composition in the direction of film thickness. The results confirm that the Fe concentration in the antiferromagnetic film 23 increased toward the interface thereof with the ferromagnetic film 22 and the Fe was diffused from the ferromagnetic film 22 toward the $Ir_{25}Mn_{75}$ antiferromagnetic film 23. This antiferromagnetic film 23 was found to have a composition of $(Ir_{0.25}Mn_{0.75})_{9.95}Fe_{0.5}$.

Table 3 shows the results of the test for exchange bias magnetic field and blocking temperature performed before and after the heat treatment. Table 3 additionally shows the results similarly obtained of an exchange coupling film which was produced by laminating a $Co_{81}Fe_9Pd_{10}$ ferromagnetic film on a γ-FeMn antiferromagnetic film.

It is clearly noted from Table 3 that the exchange coupling film after the heat treatment showed a large exchange bias magnetic field and a very high blocking temperature as compared with the exchange coupling film using a γ-FeMn antiferromagnetic film. Similar results were obtained in the case of an exchange coupling film using an antiferromagnetic film of an $Ir_{x'}Mn_{1-x'}$ alloy wherein the value of x' was other than 0.25.

TABLE 3

| | | Exchange bias magnetic field, A/m | Blocking temperature, °C. |
|---|---|---|---|
| | γ-FeMn | 13000 | 190 |
| Example 10 | Before heat treatment | 12000 | 300 |
| | After heat treatment | 14000 | 290 |

EXAMPLE 11

Exchange coupling films were produced by following the procedure of Example 6 while using antiferromagnetic films incorporating severally Ni, Cu, Ta, Hf, Pd, Ti, Nb, and Cr at a fixed ratio of 10 at % in $(Ir_{0.25}Mn_{0.75})_{80}Fe_{20}$. The resultant exchange coupling films were left standing overnight in water and then tested for ratio of occurrence of corrosion pits. Table 4 shows the results of this test.

TABLE 4

| Added element | Ratio of occurrence of corrosion pits (%) |
|---|---|
| Cr | 13 |
| Nb | 18 |
| Ti | 16 |
| Pd | 12 |
| Hf | 11 |
| Ta | 12 |
| Cu | 13 |
| Ni | 14 |
| None | 23 |

It is clearly noted from Table 4 that the exchange coupling films using the antiferromagnetic films incorporating therein the elements enumerated above showed better corrosion resistance than an exchange coupling film using an antiferromagnetic film containing no such additive element.

EXAMPLE 12

Figure 17:
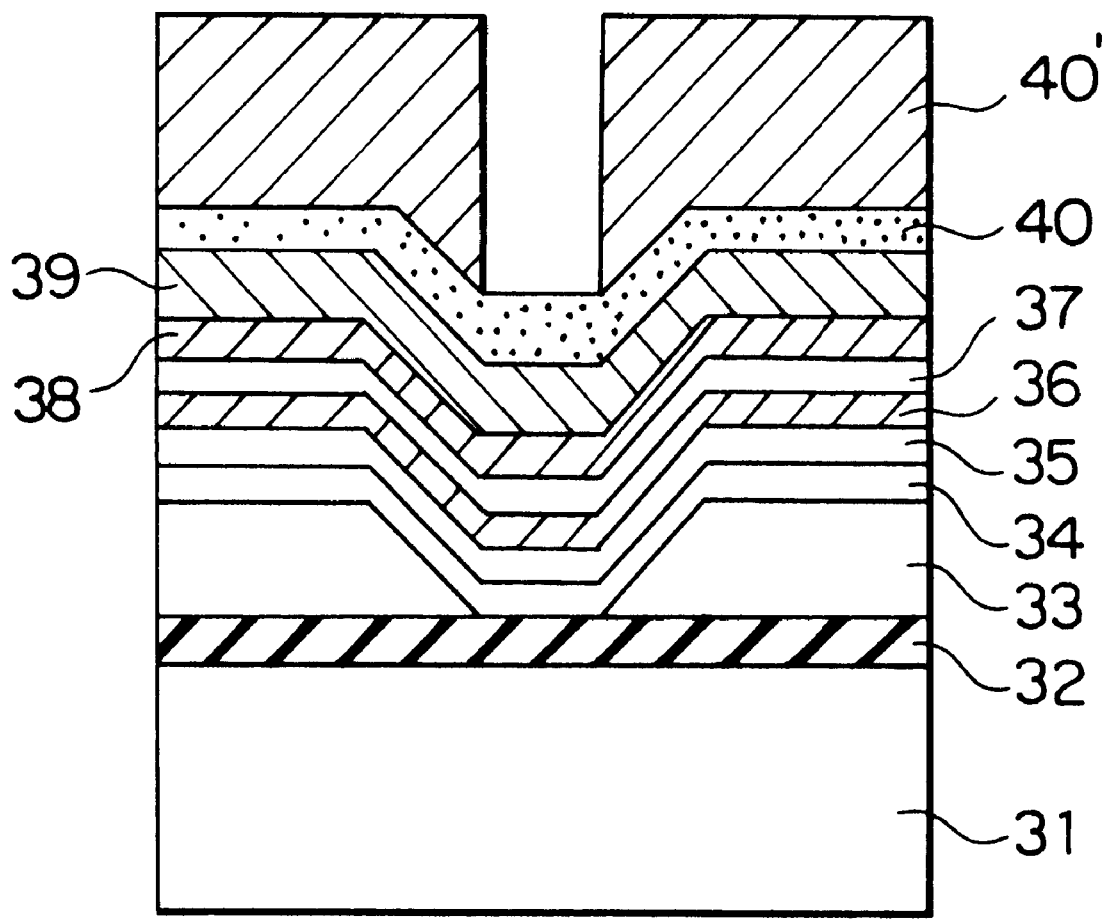
FIG. 17 is a longitudinal cross section showing a magnetoresistive element in Example 13 of this invention.

A magnetoresistive element constructed as shown in FIG. 17 was produced. Specifically, a hard film 33 of $Co_{83}Pt_{17}$ 40 nm in thickness was deposited on a thermal oxide layer 32 formed on the surface of a silicon substrate 31 and a part of the hard film 33 was selectively removed to expose the underlying thermal oxide layer 32 partially. Then, a $Co_{88}Zr_5Nb_7$ film 34 having a thickness of 10 nm, a $Ni_{80}Fe_{20}$ film 35 having a thickness of 2 nm, a $Co_{90}Fe_{10}$ ferromagnetic film 36 having a thickness of 4 nm, a Cu film 37 having a thickness of 3 nm, a $Co_{90}Fe_{10}$ ferromagnetic film 38 having a thickness of 3 nm, a $(Ir_{0.25}Mn_{0.75})_{80}Fe_{20}$ antiferromagnetic film 39 having a thickness of 15 nm, and a Ti protective film 40 having a thickness of 20 nm were sequentially deposited thereon in the order mentioned. Further, a Cu electrode 40' having a thickness of 0.1 μm was superposed thereon.

The superposed films were heat-treated in a magnetic field and then the hard film 33 was magnetized. The heat treatment in the magnetic field imparted unidirectional anisotropy to the coupling between the antiferromagnetic film 39 and the ferromagnetic film 38 and uniaxial anisotropy to the $Co_{88}Zr_5Nb_7$ film 34, the $Ni_{80}Fe_{20}$ film 35, and the $Co_{90}Fe_{10}$ ferromagnetic film 36. The annealing conditions were the same as in Example 5.

The magnetoresistive element was exposed to an externally applied magnetic field and tested for responsivity to a magnetic field. The results of this test indicate that this film produced a stable output equal to or better than that obtained of a magnetoresistive element using a γ-FeMn alloy for an antiferromagnetic film and emitted no perceptible Barkhausen noise attendant on a shift of domain wall.

Further, the $(Ir_{0.25}Mn_{0.75})_{80}Fe_{20}$ antiferromagnetic film 39 showed a greater corrosion resistance and higher blocking temperature than an antiferromagnetic film using a γ-FeMn alloy. The magnetoresistive element, therefore, was produced with a notably augmented yield.

As described in detail above, the exchange coupling film of this invention exhibits an ideal force of exchange coupling and excels in corrosion resistance and thermal stability.

The magnetoresistive element which is provided with this exchange coupling film can yield a stable output for a long time and, therefore, proves extremely valuable from the economic point of view.

EXAMPLE 13

A magnetoresistive element constructed as shown in FIG. 17 was produced. Specifically, a hard film 33 of $Co_{83}Pt_{17}$ 40 nm in thickness was deposited on a thermal oxide layer 32 formed on the surface of a silicon substrate 31 and a part of the hard film 33 was selectively removed to expose the underlying thermal oxide layer 32 partially. Then, a $Co_{88}Zr_5Nb_7$ film 34 having a thickness of 10 nm, a $Ni_{80}Fe_{20}$ film 35 having a thickness of 2 nm, a $Co_{90}Fe_{10}$ ferromagnetic film 36 having a thickness of 4 nm, a Cu film 37 having a thickness of 3 nm, a $Co_{90}Fe_{10}$ ferromagnetic film 38 having a thickness of 2 nm, a $(Ir_{0.20}Mn_{0.80})_{80}Fe_{20}$ antiferromagnetic film 39 having a thickness of 8 nm, and a Ta protective film 40 having a thickness of 20 nm were sequentially superposed thereon in the order mentioned. Further, a Cu electrode 40' having a thickness of 0.1 μm was superposed thereon. The annealing conditions were the same as in Example 5.

The superposed films were heat-treated in a magnetic field and then the hard film 33 was magnetized. The heat treatment in the magnetic field imparted unidirectional anisotropy to the bond between the antiferromagnetic film 39 and the ferromagnetic film 38 and uniaxial anisotropy to the $Co_{88}Zr_5Nb_7$ film 34, the $Ni_{80}Fe_{20}$ film 35, and the $Co_{90}Fe_{10}$ ferromagnetic film 36.

The magnetoresistive element was exposed to an externally applied magnetic field and tested for responsivity to a magnetic field. The results of this test indicate that this film produced a stable output equal to or better than that obtained of a magnetoresistive element using a γ-FeMn alloy for an antiferromagnetic film and emitted no perceptible Barkhausen noise attendant on a shift of magnetic domain wall.

Further, the $(Ir_{0.20}Mn_{0.80})_{80}Fe_{20}$ antiferromagnetic film 39 showed a greater corrosion resistance and higher blocking temperature than an antiferromagnetic film using a γ-FeMn alloy. The magnetoresistive element, therefore, was produced with a notably augmented yield.

As described in detail above, the exchange coupling film of this invention exhibits an ideal force of exchange coupling and excels in corrosion resistance and thermal stability.

The magnetoresistive element which is provided with this exchange coupling film can yield a stable output for a long time and, therefore, proves extremely valuable from the economic point of view.

EXAMPLE 14

Figure 18:
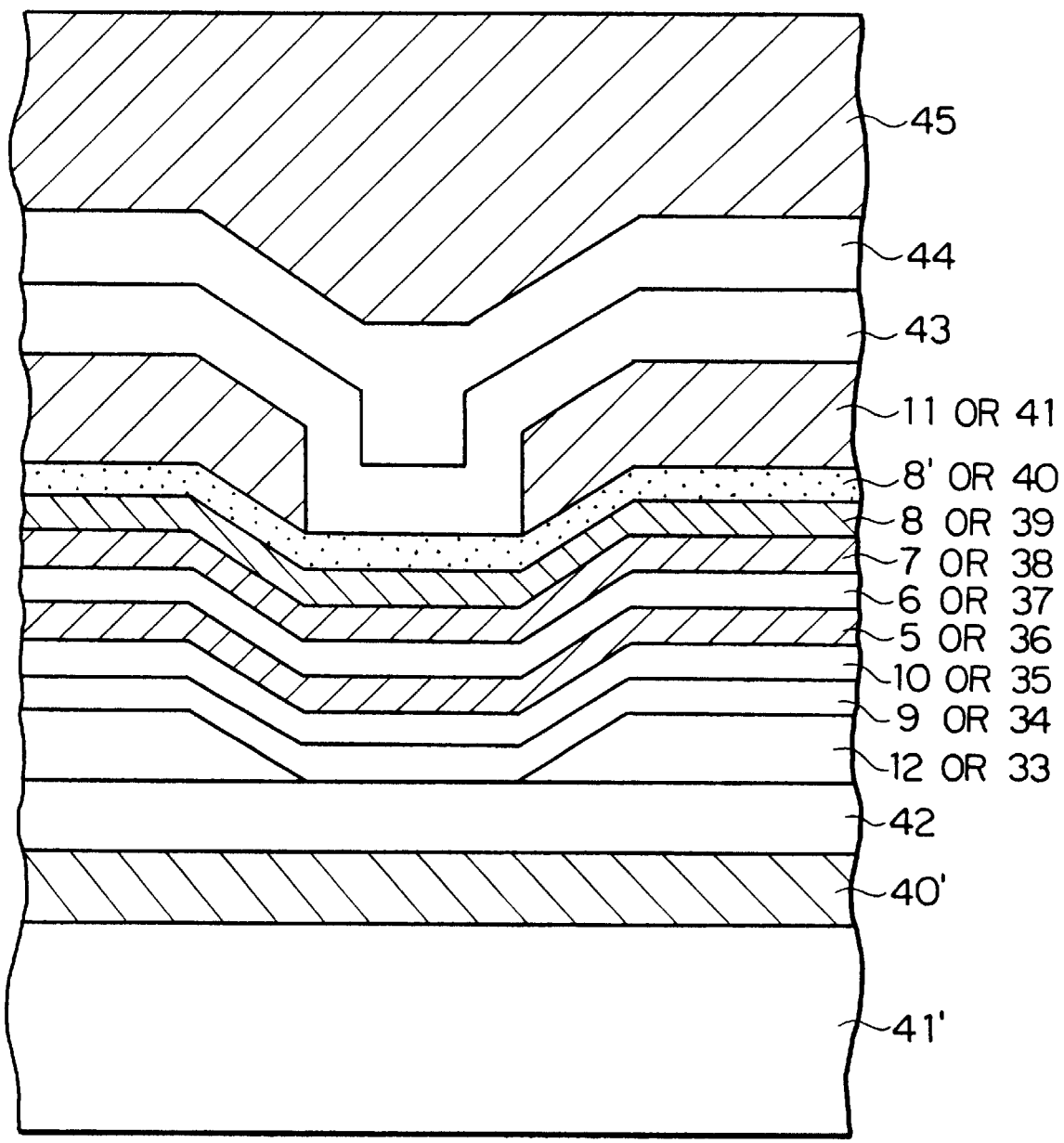
FIG. 18 is a longitudinal cross section showing a magnetoresistive element in Example 14 of this invention.

Magnetoresistive elements similar in structure to those produced in Examples 4, 5, 11, and 12 were severally superposed on a laminate consisting of an $Al_2O_3$-TiC substrate 41', a lower shield film 41, and a lower gap film 42 and an upper gap film 43 and an upper shield film 44 and a protective film 45 were further superposed thereon as shown in FIG. 18. Thus, a regenerating magnetic head was produced. The annealing conditions were the same as in Example 5. The head using the IrMn type alloy and enjoying high corrosion resistance realized such a fine fabrication depth of 0.1 μm and such a large regeneration out as have never been attained by a FeMn type alloy inherently vulnerable to corrosion.

What is claimed is:

1. An exchange coupling film comprising:

a ferromagnetic film comprising a Co or Co alloy having a face-centered cubic crystal structure of hexagonal closest packing crystal structure, and an antiferromagnetic film laminated on the ferromagnetic film, wherein the antiferromagnetic film comprises an IrMn alloy represented by the general formula $Ir_xMn_{100-x}$, where x represents a value by atomic % satisfying the expression $2 \leq x \leq 80$, and where the IrMn alloy consists essentially of a face-centered cubic crystal structure.

2. The exchange coupling film according to claim 1, wherein x is a value satisfying the expression $5 \leq x \leq 40$.

3. The exchange coupling film according to claim 1, wherein the antiferromagnetic film further comprises at least one element selected from the group consisting of Ni, Cu, Ta, Hf, Pd, Ti, Nb, Cr, Si, Al, W, Zr, Ga, Be, In, Sn, V, Mo, Re, Co, Ru, Rh, Pt, Ge, Os, Ag, Cd, Zn, Au, and N, at a ratio of not more than 50 atomic % based on 100 atomic % of the IrMn alloy.

4. The exchange coupling film according to claim 1, wherein the Co alloy further comprises Pd.

5. The exchange coupling film according to claim 1, wherein the ferromagnetic film is laminated on the antiferromagnetic film through an interface comprising Fe or a Fe alloy.

6. A magnetoresistive element comprising an exchange coupling film set forth in claim 1, and an electrode for feeding an electric current to at least a ferromagnetic film of the exchange coupling film.

7. The exchange coupling film according to claim 1, wherein the IrMn alloy has an ordered phase.

8. A magnetoresistive element comprising an exchange coupling film as set forth in claim 1, further comprising another ferroagnetic film, and a nonmagnetic film diposed between the ferromagnetic film of the exchange coupling film and the another ferromagnetic film, and an electrode electrically coupled to the exchange coupling film, the nonmagnetic film, and the another ferromagnetic film.

9. The exchange coupling film according to claim 1, wherein the antiferromagnetic film consists essentially of the IrMn alloy.

10. The exchange coupling film according to claim 1, wherein the IrMn alloy has (111) plane orientation.

11. The exchange coupling film according to claim 1, wherein the antiferromagnetic film includes iron.

12. The exchange coupling film according to claim 1, wherein the ferromagnetic film comprises an alloy of iron and cobalt.

* * * * *